US006703628B2

(12) United States Patent
Ye et al.

(10) Patent No.: US 6,703,628 B2
(45) Date of Patent: Mar. 9, 2004

(54) METHOD AND SYSTEM FOR ION BEAM CONTAINMENT IN AN ION BEAM GUIDE

(75) Inventors: John Zheng Ye, Brighton, MA (US); Victor M. Benveniste, Gloucester, MA (US); Michael Paul Cristoforo, Beverly, MA (US)

(73) Assignee: Axceliss Technologies, Inc, Beverly, MA (US)

( * ) Notice: Subject to any disclaimer, the term of this patent is extended or adjusted under 35 U.S.C. 154(b) by 0 days.

(21) Appl. No.: 10/444,413

(22) Filed: May 23, 2003

(65) Prior Publication Data

US 2003/0201402 A1 Oct. 30, 2003

Related U.S. Application Data

(63) Continuation-in-part of application No. 10/210,124, filed on Jul. 31, 2002, and a continuation-in-part of application No. 09/865,155, filed on May 24, 2001, which is a continuation-in-part of application No. 09/625,153, filed on Jul. 25, 2000, now Pat. No. 6,414,329.

(51) Int. Cl.[7] .............................................. H01J 37/317

(52) U.S. Cl. ................................................. 250/492.21

(58) Field of Search ..................... 250/492.21, 396 R, 250/396 ML

(56) References Cited

U.S. PATENT DOCUMENTS

| 4,383,177 A | 5/1983 | Keller et al. |
| 4,447,732 A | 5/1984 | Leung et al. |
| 4,686,365 A | 8/1987 | Meek et al. |
| 4,780,642 A | 10/1988 | Jacquot |
| 5,206,516 A | 4/1993 | Keller et al. |
| 5,350,926 A | 9/1994 | White et al. |
| 5,433,788 A | 7/1995 | Mochizuki et al. |
| 5,497,006 A | 3/1996 | Sferlazzo et al. |
| 5,523,652 A | 6/1996 | Sferlazzo et al. |
| 5,554,857 A | 9/1996 | Benveniste |
| 5,576,538 A | 11/1996 | Sakai et al. |
| 5,661,308 A | 8/1997 | Benveniste et al. |
| 5,703,375 A | 12/1997 | Chen et al. |
| 5,707,452 A | 1/1998 | Dandl |
| 5,750,987 A | 5/1998 | Ichimura et al. |
| 5,760,405 A | 6/1998 | King et al. |
| 5,811,823 A | 9/1998 | Blake et al. |
| 5,825,038 A | 10/1998 | Blake et al. |
| 5,834,786 A | 11/1998 | White et al. |
| 5,925,886 A | 7/1999 | Seki et al. |
| 5,932,882 A * | 8/1999 | England et al. ........ 250/492.21 |
| 5,975,014 A | 11/1999 | Dandl |
| 6,016,036 A | 1/2000 | Brailove |
| 6,060,718 A | 5/2000 | Brailove et al. |
| 6,100,536 A | 8/2000 | Ito et al. |
| 6,130,436 A | 10/2000 | Renau et al. |
| 6,135,128 A | 10/2000 | Graf et al. |

(List continued on next page.)

FOREIGN PATENT DOCUMENTS

| JP | 406036735 A | 2/1994 |
| JP | 7-340297 | 12/1995 |

OTHER PUBLICATIONS

"Charged Particle Beams", Acceleration and Transport of Neutralized Ion Beams, Stanley Humphries, Jr., 1990, pp. 528–534.

*Primary Examiner*—Kiet T. Nguyen
(74) *Attorney, Agent, or Firm*—Eschweiler & Associates, LLC

(57) ABSTRACT

Ion implantation systems and beamline assemblies therefor are provided, in which multi-cusped magnetic fields are provided in a beamguide and the beamguide is energized to provide microwave electric fields in a traveling wave along the beamguide passageway. The magnetic and electric fields interact to provide an electron-cyclotron resonance condition for beam containment in the beamguide passageway.

36 Claims, 17 Drawing Sheets

U.S. PATENT DOCUMENTS

| | | |
|---|---|---|
| 6,207,963 B1 | 3/2001 | Benveniste |
| 6,207,964 B1 | 3/2001 | McIntyre et al. |
| 6,242,750 B1 | 6/2001 | Takahashi et al. |
| 6,271,529 B1 | 8/2001 | Cwik et al. |
| 6,294,862 B1 | 9/2001 | Brailove et al. |
| 6,297,594 B1 | 10/2001 | Sakai et al. |
| 6,313,475 B1 | 11/2001 | Renau et al. |
| 6,414,329 B1 | 7/2002 | Benveniste et al. |
| 6,541,781 B1 | 4/2003 | Benveniste et al. |

* cited by examiner

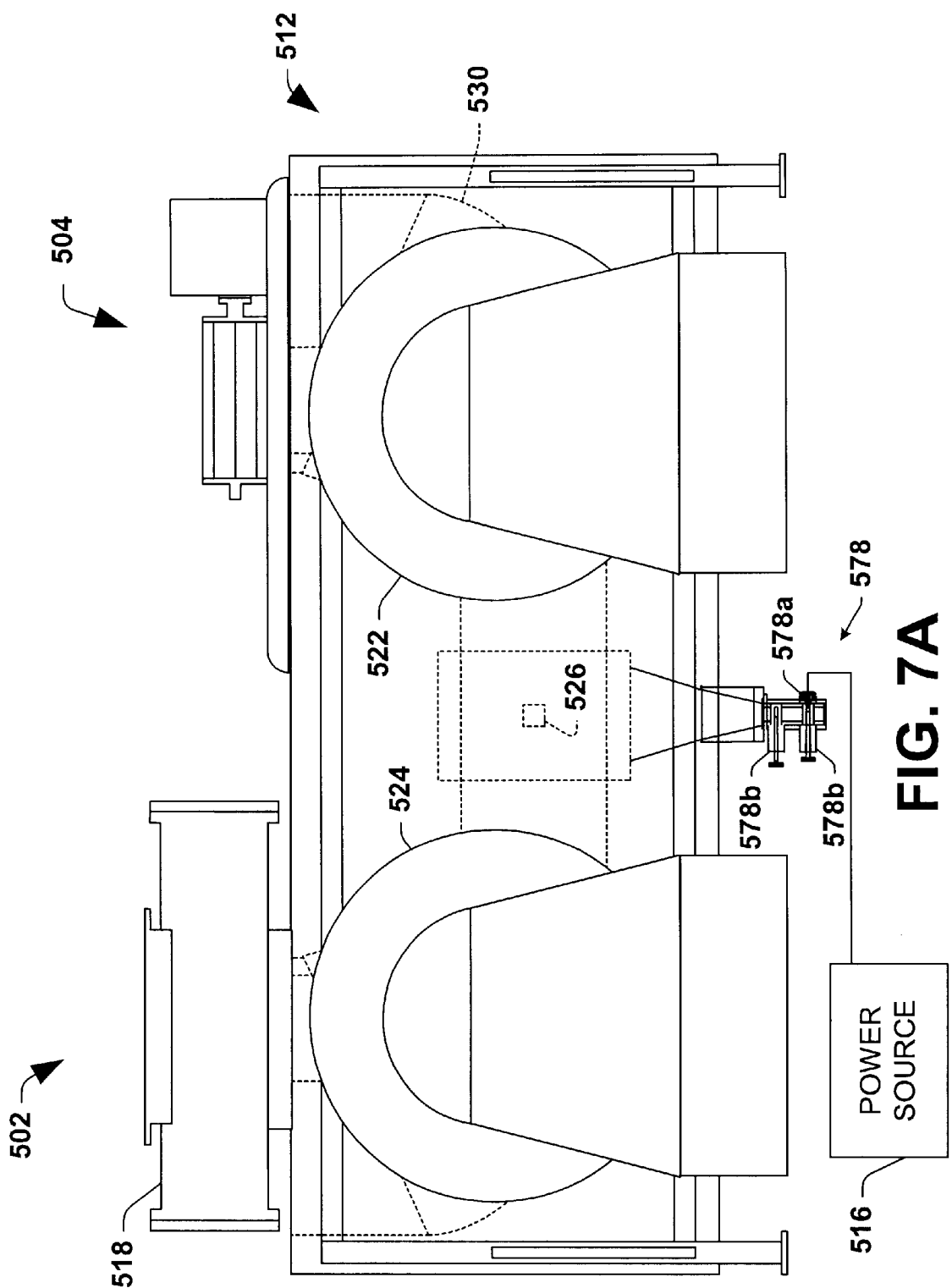

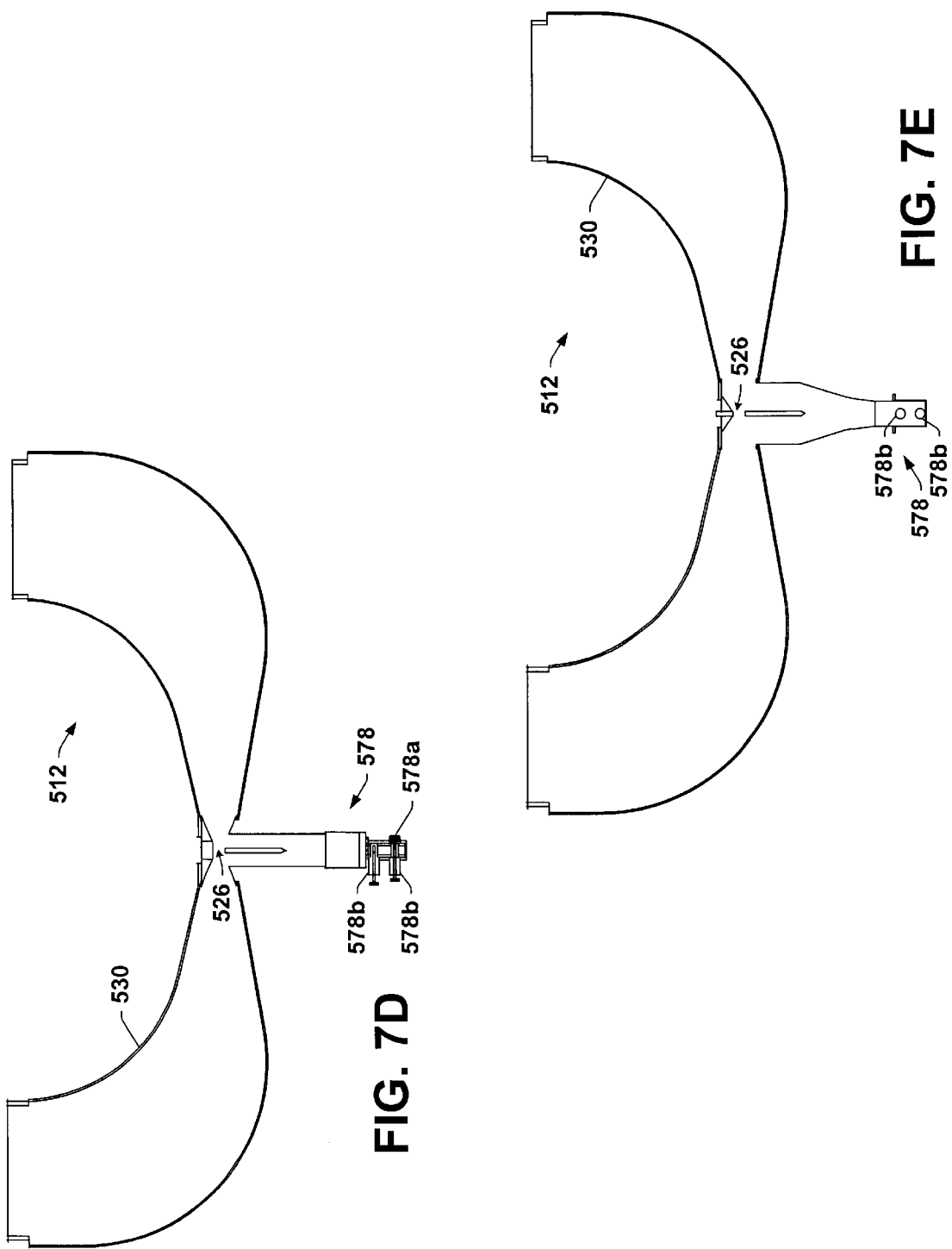

METHOD AND SYSTEM FOR ION BEAM CONTAINMENT IN AN ION BEAM GUIDE

RELATED APPLICATIONS

This application is a Continuation-In-Part of Ser. No. 10/210,124 filed Jul. 31, 2002, which is entitled "Symmetric Beamline and Methods for Generating a Mass-Analyzed Ribbon Ion Beam", and is also a Continuation-In-Part of Ser. No. 09/865,155 filed May 24, 2001, which is entitled "Method and System for Ion Beam Containment in an Ion Beamguide", which is a Continuation-In-Part of Ser. No. 09/625,153 filed Jul. 25, 2000 now U.S. Pat. No. 6,414,329, which is entitled "Method and System for Microwave Excitation of Plasma in an Ion Beam Guide", the disclosures of which are hereby incorporated by reference as if fully set forth herein.

FIELD OF THE INVENTION

The present invention relates generally to ion implantation systems, and more specifically to an improved apparatus and systems for ion beam containment in an ion implantation system.

BACKGROUND OF THE INVENTION

In the manufacture of semiconductor devices, ion implantation is used to dope semiconductors with impurities. Ion beam implanters or ion implantation systems are employed to treat silicon wafers with an ion beam, so as to produce n or p type doped regions or to form passivation layers during fabrication of integrated circuits. When used for doping semiconductors, the ion implantation system injects a selected ion species to produce the desired extrinsic material. Implanting ions generated from source materials such as antimony, arsenic or phosphorus results in n type extrinsic material wafers, whereas if p type extrinsic material wafers are desired, ions generated with source materials such as boron, gallium or indium may be implanted. Ion implantation systems typically include an ion source for generating positively charged ions from such ionizable source materials. The generated ions are extracted from the source and formed into an ion beam, which is directed along a predetermined beam path in a beamline assembly to an implantation station, sometimes referred to as an end station. The ion implantation system may include beam forming and shaping structures extending between the ion source and the end station, which maintain the ion beam and bound an elongated interior cavity or passageway through which the beam is transported en route to one or more wafers or workpieces supported in the end station. The ion beam transport passageway is typically evacuated to reduce the probability of ions being deflected from the predetermined beam path through collisions with air molecules.

The charge-to-mass ratio of an ion affects the degree to which it is accelerated both axially and transversely by an electrostatic or magnetic field. Ion implantation systems typically include a mass analyzer in the beamline assembly downstream of the ion source, having a mass analysis magnet creating a dipole magnetic field across the beam path in the passageway. This dipole field operates to deflect various ions in the ion beam via magnetic deflection in an arcuate section of the passageway, which effectively separates ions of different charge-to-mass ratios. The process of selectively separating ions of desired and undesired charge-to-mass ratios is referred to as mass analysis. In this manner, the beam imparted on the wafer can be made very pure since ions of undesirable molecular weight will be deflected to positions away from the beam path and implantation of other than desired materials can be avoided.

High energy ion implantation is commonly employed for deeper implants in a semiconductor wafer. Conversely, high current, low energy ion beams are typically employed for shallow depth ion implantation, in which case the lower energy of the ions commonly causes difficulties in maintaining convergence of the ion beam. In particular, high current, low energy ion beams typically include a high concentration of similarly charged (positive) ions which tend to diverge due to mutual repulsion, a space charge effect sometimes referred to as beam blowup. Beam blowup is particularly troublesome in high current, low energy applications because the high concentration of ions in the beam (high current) exaggerates the force of the mutual repulsion of the ions, while the low propagation velocity (low energy) of the ions expose them to these mutually repulsive forces for longer times than in high energy applications. Space Charge Neutralization is a technique for reducing the space charge effect in an ion implanter through provision and/or creation of a beam plasma, comprising positively and negatively charged particles as well as neutral particles, wherein the charge density of the positively and negatively charged particles within the space occupied by the beam are generally equal. For example, a beam plasma may be created when the positively charged ion beam interacts with residual background gas atoms, thereby producing ion electron pairs through ionizing collisions during beam transport. As a result, the ion beam becomes partially neutralized through interaction with the background residual gas in the beam path.

In the case of high energy ion implantation, the ion beam typically propagates through a weak plasma that is a byproduct of the beam interactions with the residual or background gas. This plasma tends to neutralize the space charge caused by the ion beam by providing negatively charged electrons along the beam path in the passageway, thereby largely eliminating transverse electric fields that would otherwise disperse or blow up the beam. However, at low ion beam energies, the probability of ionizing collisions with the background gas is very low. Also, in the dipole magnetic field of a mass analyzer, plasma diffusion across magnetic field lines is greatly reduced while the diffusion along the direction of the field is unrestricted. Consequently, introduction of additional plasma to improve low energy beam containment in a mass analyzer is largely futile, since the introduced plasma is quickly diverted along the dipole magnetic field lines to the passageway sidewalls. Furthermore, low energy implantation systems typically suffer from electrons being lost to the sidewalls along the beamline assembly, which reduces the number of such electrons available for space charge neutralization. Thus, there is a need for improved ion implantation systems and apparatus for reducing electron loss to enhance space charge neutralization and prevent or reduce beam blowup.

SUMMARY OF THE INVENTION

The present invention is directed to Ion implantation systems and beamline assemblies, in which multi-cusped magnetic fields are provided in a beamguide and the beamguide is energized to provide microwave electric fields in a traveling wave along the beamguide passageway. The magnetic and electric fields interact to provide an electron-cyclotron resonance (ECR) condition for beam containment in the beamguide passageway. The invention may be employed in conjunction with the transport of ion beams of any energy and form factor, such as low or ultra-low energy ion beams having circular or elongated profiles (e.g., pencil beams and/or ribbon beams) or beams of other shapes.

The inventors have appreciated that ion beams propagating through a plasma, such as the beam plasma created by beam interactions with the residual or background gas, reach a steady state equilibrium wherein charges produced by ionization and charge exchange are lost to the beamguide in ion implanters. The remaining plasma density results from a balance between charge formation due to the probability of ionizing collisions, and losses from the beam volume due to repulsion of positive charges by the residual space charge and electron escape as a result of kinetic energy. Absent plasma enhancement through the introduction of externally generated plasma or enhancement of the beam plasma, the probability for ionizing collisions with the background gas at very low ion beam energies is relatively low. Electrons generated in such a manner are trapped in the beam's large potential well, orbiting around and through the beam, interacting with each other by Coulomb collisions, resulting in thermalization of the electron energy distribution. Those electrons in the distribution having an energy greater than the ionization potential of a residual gas molecule have a probability of ionizing such a molecule. The ionizing probability decreases as the electron energy decreases.

In a low energy beam plasma, the majority of the ionization is produced by the trapped electrons. These electrons derive their energy from the center-to-edge beam potential difference, which is the same parameter that causes beam "blow-up". Thus, transportation of low energy ion beams is difficult absent externally generated plasma or enhancement of the beam plasma. Because mass analyzers inherently involve magnetic fields, externally generated plasma fails to diffuse adequately along the arcuate length of a mass analyzer beamguide, instead diffusing quickly along the direction of the magnetic field lines. The inventors have further appreciated that additional plasma may also be generated within the ion beam space by electric fields at microwave frequencies. In this approach, microwave energy is transferred efficiently to plasma electrons when a proper magnetic field is present at a magnitude that yields the ECR condition.

In accordance with an aspect of the invention, ion implantation systems and beamline assemblies therefor are provided, wherein magnetic fields and microwave electric fields are provided along all or portions of a beamguide passageway, which interact to provide beam containment through plasma enhancement along the beamguide. In the examples illustrated and described herein, the microwave electric fields and the multi-cusped magnetic fields provide an electron cyclotron resonance condition along at least a portion of the passageway for plasma enhancement in order to prevent or inhibit beam blow-up conditions during beam transport. A beamline assembly is provided, which comprises a beamguide having at least one wall defining a passageway for transportation of an ion beam along a beam path, as well as a magnetic device and a power source. The magnetic device generates multi-cusped magnetic fields in the beamguide passageway, wherein the magnetic device may be a plurality of magnets mounted along at least a portion of the passageway, such as a plurality of magnets mounted along an outer surface of one or more beamguide walls in one implementation illustrated and described below.

The power source is coupled with the beamguide to provide microwave electric fields in the beamguide passageway, where the beamguide operates as a waveguide to support the microwave electric fields. The beamguide may comprise top, bottom, and side walls defining the beamguide passageway along the path, wherein the beamguide supports a traveling wave propagating along the beamguide. In the illustrated implementations, a feed port is located along one of the beamguide walls and a microwave coupler is connected to the feed port to couple microwave power from the power source to the beamguide for exciting a single microwave mode or multiple microwave modes as a traveling wave along the beamguide. The beamguide may also include an entrance wall with one or more apertures along the path through which the ion beam passes. The entrance wall may operate as a cutoff for the microwave mode or modes to create a reflected wave propagating along the beamguide in the direction toward the exit end. The feed port may be spaced from the entrance wall by a distance such that the reflected wave and an incoming wave from the feed port are generally in phase to provide the traveling wave propagating along the beamguide in the direction toward the exit end of the beamguide.

Another aspect of the invention involves ion beam containment methods comprising providing an ion beam along a longitudinal path from an ion source to an end station, providing a multi-cusped magnetic field in a beamguide passageway between the ion source and the end station, and providing a traveling wave along the beamguide, wherein microwave electric fields of the traveling wave and the multi-cusped magnetic field cooperate to provide ion beam containment along at least a portion of the beamguide passageway. The traveling wave may be created by providing microwave power to the beamguide to excite a single microwave mode or multiple microwave modes as a traveling wave propagating along the beamguide in a direction toward the end station.

The following description and annexed drawings set forth in detail certain illustrative aspects and implementations of the invention. These are indicative of but a few of the various ways in which the principles of the invention may be employed.

Other objects, advantages and novel features of the invention will become apparent from the following detailed description of the invention when considered in conjunction with the drawings.

BRIEF DESCRIPTION OF THE DRAWINGS

FIG. 7A is a side elevation view illustrating another exemplary ion implantation system with beam confinement apparatus in accordance with the invention;

FIGS. 7D and 7E are side elevation views illustrating alternate beamguide implementations in the system in FIG. 7A;

DETAILED DESCRIPTION OF THE INVENTION

Figure 1A:
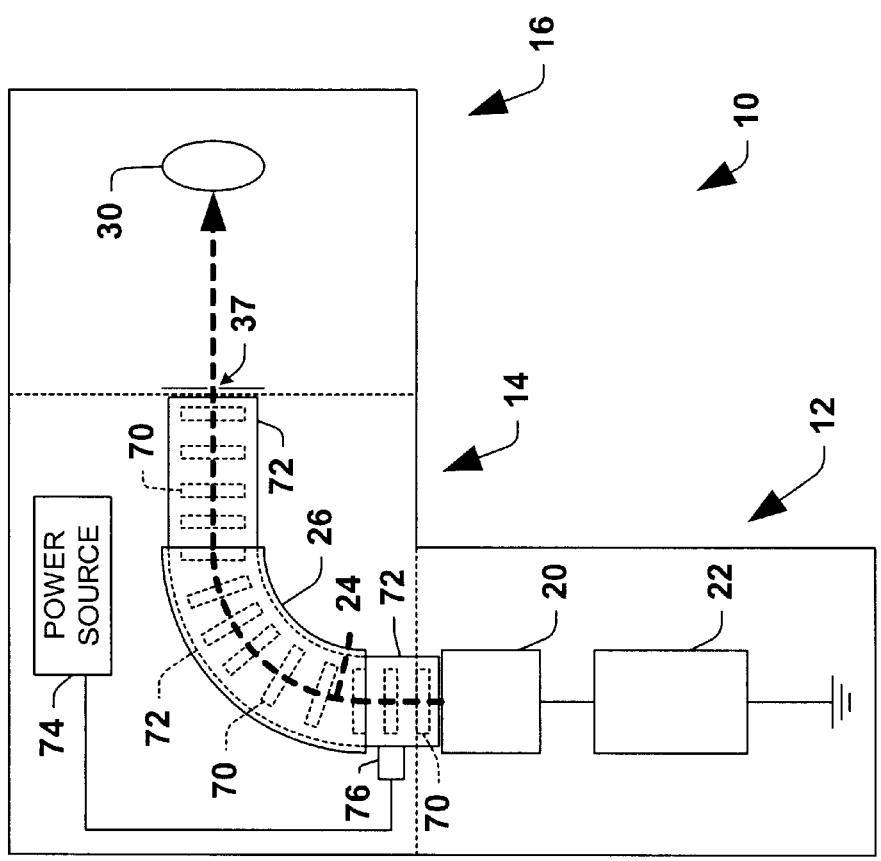
FIG. 1A is a simplified schematic diagram illustrating an exemplary low energy ion implantation system having a magnetic device and a power supply energizing a beamguide for beam containment in accordance with an aspect of the present invention.
Figure 1B:
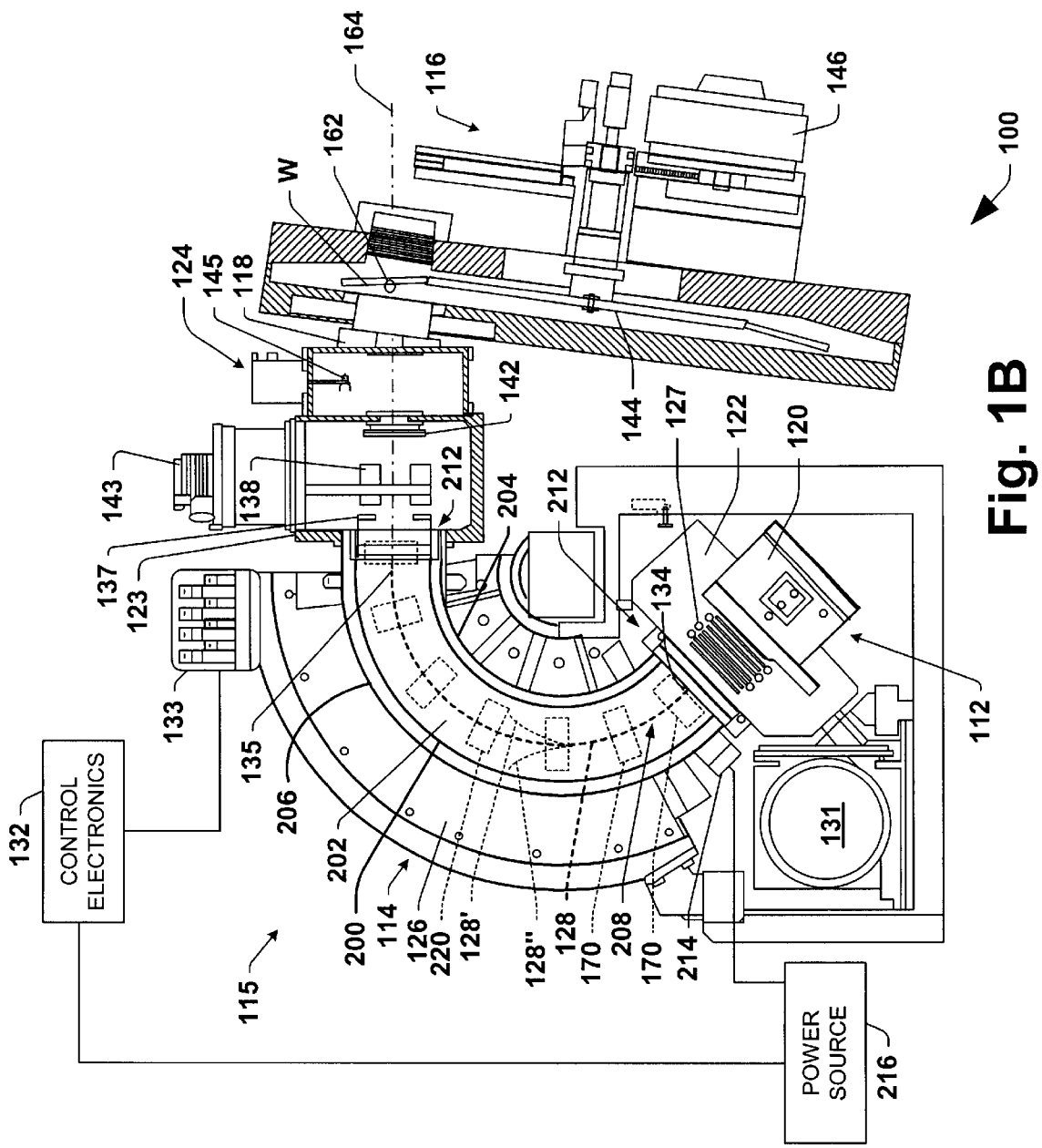
FIG. 1B is a sectional top plan view of another low energy ion implantation system in accordance with the invention.

The present invention will now be described with reference to the drawings wherein like reference numerals are used to refer to like elements throughout. The present invention provides for beam containment in ion implantation systems, such as low energy, high current implanters operated at low pressures, without requiring the introduction of externally generated plasma by enhancing the beam plasma using multi-cusp magnetic fields and high frequency electric fields to create electron cyclotron resonance (ECR) regions or zones in a beamguide passageway through which an ion beam is transported.

In the drawings and the corresponding description below, several examples of low energy implantation systems and beamline assemblies therefor are presented in order to illustrate the various aspects of the invention. However, it will be appreciated that the invention may be advantageously employed in implementations apart from those illustrated and described herein. For example, various exemplary implementations are illustrated and described hereinafter in the context of beam containment apparatus located generally along the entire length of a beamline assembly beamguide situated between an ion source and an end station or a resolver housing upstream from the end station. Other implementations of the invention are possible within the scope of the appended claims, for example, wherein one or more magnetic devices and energized portions of a beamguide are situated anywhere along the beam path between the ion source and the end station. In addition, the various aspects of the present invention may be carried out in association with high energy implanters, such as those including linear accelerator devices. Furthermore, although illustrated in association with batch type end stations, the invention may alternatively be carried out with other types of end stations, including but not limited to serial end stations in which a single wafer is implanted.

Referring initially to FIG. 1A, a simplified low energy ion implantation system 10 is schematically illustrated in accordance with the present invention, having a terminal 12, a beamline assembly 14, and an end station 16. The terminal 12 comprises an ion source 20 powered by a high voltage power supply 22. The ion source 20 produces an ion beam 24 (illustrated in dashed line in FIG. 1A) which is directed to the beamline assembly 14. The ion beam 24 is conditioned by a mass analyzer 26 in the beamline assembly 14, where a dipole magnetic field is established in the mass analyzer 26 which operates to pass only ions of appropriate charge-to-mass ratio through a resolving aperture 37 to a wafer 30 in the end station 16. The end station 16 may be any type of end station, such as a serial end station operative to support a single wafer workpiece 30 or a batch end station adapted to support multiple wafers 30 for concurrent implantation, wherein the conditioned ion beam 24 is directed toward the target wafer 30 in the end station 16.

In accordance with the invention, the system 10 also comprises an ion beam confinement apparatus including a magnetic device comprised of a plurality of permanent magnets 70, an energizable conductive beamguide 72, and a high frequency power source 74 associated with the beamline assembly 14. The power source 74 is coupled to the beamguide 72 via a feed port 76 located at the beamguide side wall, where the magnetic fields created by the magnets 70 and high frequency electric fields generated by the power source 74 and supported by the beamguide 72 cooperate to promote ion beam space charge neutralization and thereby to reduce the likelihood of blowup of the ion beam 24 during transmission through the system 10. The beamguide 72 provides a passageway for the ion beam between the ion source 20 and the end station 16 which passes through the mass analyzer 26.

In the illustrated example, the permanent magnets 70 are situated along the extent of the passageway defined by the beamguide 72, although alternative implementations may provide magnetic fields along only a portion thereof. In addition, the exemplary beamline assembly 14 and other implementations illustrated and described below have the magnets 70 mounted along outer surfaces of the upper and lower (e.g., top and bottom) beamguide walls. However, other implementations are possible, for example, wherein magnetic devices 70 are located along one or more sides or walls of the beamguide 72, which may be alternatively or in combination mounted inside the passageway defined by the beamguide walls, wherein the invention contemplates any magnetic device adapted to provide multi-cusped magnetic fields within the beam passageway or portions thereof.

As with the implementations described below, the beamline assembly 14 provides ECR plasma in the beamguide 72 for beam containment along the path of the ion beam 24 by generating multi-cusped magnetic fields using the magnets 70 and high frequency electric fields using the beamguide 72 and the power source 74. In one particular example, the power source 74 operates at a microwave frequency of 2.45 GHz to establish ECR regions in the beamguide passageway where the magnetic field strength is about 875 Gauss (G). However, other implementations are possible, for example, wherein the power source 74 is operated at a frequency in the range of about 900 MHz to about 15 GHz within the scope of the invention, wherein all such frequencies are referred to herein as microwave frequencies, and the resulting fields are referred to as microwave electric fields.

Referring now to FIGS. 1B and 2–5E, an exemplary ultra low energy (ULE) ion implantation system 100 is illustrated having an ion source 112, a mass analysis magnet 114, a target or end station 116, and a beamline assembly 115 with beam containment apparatus in accordance with the invention. An expansible stainless steel bellows assembly 118 connects the end station 116 and the beamline assembly 115 to permit movement of the end station 116 with respect to the beamline assembly 115. The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The beamline assembly comprises a mass analysis magnet 114 which provides only ions of an appropriate charge-to-mass ratio to end station 116 through a resolver housing 123 and a beam neutralizer 124. The mass analysis magnet 114 includes a curved beam path 208 within a passageway 202 defined by an aluminum beamguide 200 having inner and outer side walls 204 and 206, where the passageway 202 is evacuated by a vacuum pump 131. The ion beam 128 that propagates along the path 208 is affected by the dipole magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133. The dipole magnetic field causes the ion beam 128 to move along the curved beam path 208 from a first or entrance trajectory 134 at a beamguide entrance end 210 near the ion source 112 to a second or exit trajectory 135 at an exit end 212 near the resolving housing 123. Portions 128' and 128" of the beam 128, comprised of ions having an inappropriate charge-to-mass ratio, are deflected away from the curved trajectory of the path 208 and into the sidewalls 204 and 206, respectively, of the beamguide 206. In this manner, the magnet 114 passes to the resolving housing 123 only those ions in the beam 128 which have the desired charge-to-mass ratio.

The passageway 202 further comprises a magnetic device comprised of a plurality of permanent magnets 220 disposed laterally along at least a portion of the passageway 202, which provide a multi-cusped magnetic field therein according to an aspect of the invention. The magnets 220 are mounted above and below the beam path 208 to create multi-cusped magnetic fields (not shown in FIG. 1B) in the passageway 202. High frequency (e.g., microwave) electric fields are also provided in the passageway 202 via a microwave injection port 214 which couples a power source 216 with the beamguide which supports a traveling wave. The multi-cusped magnetic fields and the high frequency electric fields cooperatively interact in the passageway 202 to create an ECR condition therein. This enhances or facilitates beam containment in the passageway 202 by generating plasma along the passageway 202.

The beam 128 is thus mass analyzed and transported from the ion source 112 through the beamguide 200 to the resolver housing 123, which includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer and resolver housings are evacuated by a vacuum pump 143. The beam 128 then passes to the end station 116, which includes a disk-shaped wafer support 144 upon which wafers W to be treated are mounted. The wafer support 144 resides in a target plane which is generally perpendicularly oriented to the direction of the implant beam. The disc shaped wafer support 144 at the end station 116 is rotated by a motor 146. The ion beam thus strikes wafers mounted to the support as they move in a circular path. The end station 116 pivots about point 162, which is the intersection of the path 164 of the ion beam and the wafer W, so that the target plane is adjustable about this point.

Figure 2:
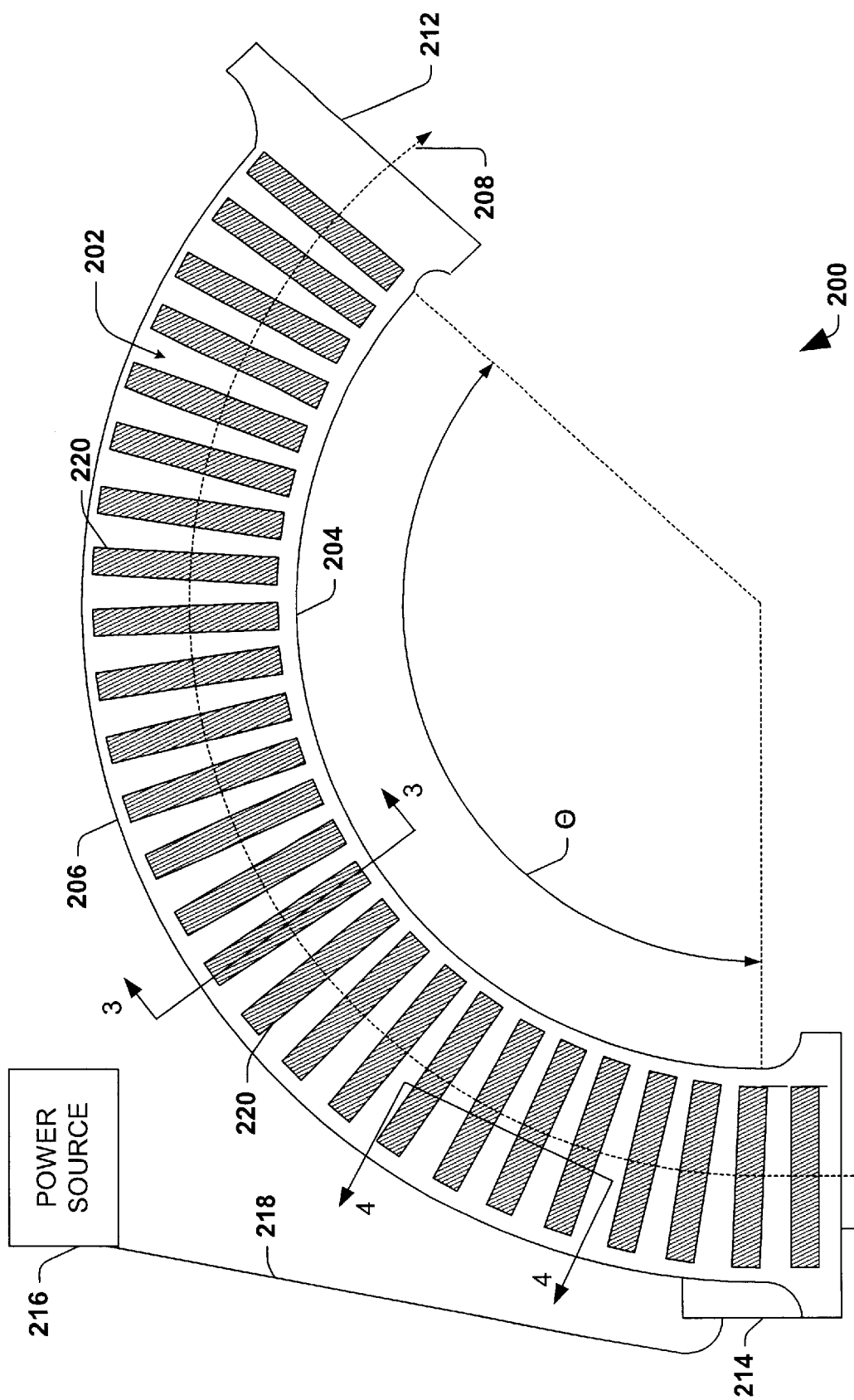
FIG. 2 is a top plan view further illustrating the beamguide of the implantation system of FIG. 1B.
Figure 3:
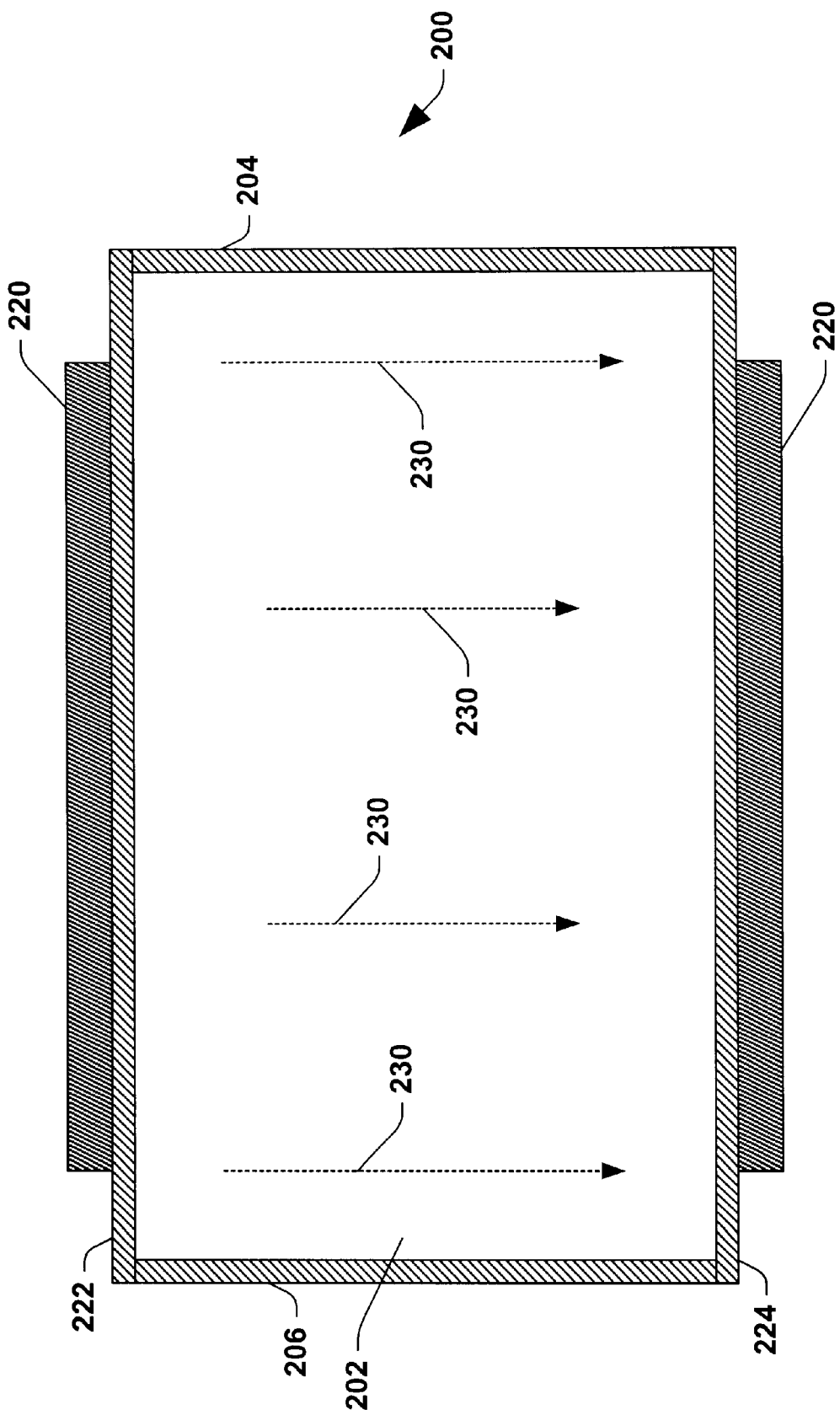
FIG. 3 is a sectional elevation view of the beamguide of FIGS. 1B and 2 taken along line 3—3 of FIG. 2.

FIGS. 2–5E illustrate further details of the exemplary beamguide 200 and the magnets 220 mounted thereon, which cooperatively generate ECR regions in the beam passageway 202 in accordance with the invention. As shown in FIGS. 2 and 3, the beamguide 200 provides an arcuate longitudinal passageway 202 defined by inner and outer arcuate side walls 204 and 206, and top and bottom walls 222, and 224, respectively, along an ion beam path 208. The beamguide walls 204, 206, 222, and 224 are fabricated from aluminum, although other non-magnetic materials may alternatively be used in accordance with the invention. The beamguide 200 extends longitudinally along the path 208 from the entrance end 210 to the exit end 212 through an arc angle θ of approximately 135 degrees.

The beamguide 200 also comprises a microwave feed or injection port 214 which couples high frequency microwave energy (e.g., 900 MHz–15 GHz) from the power source 216 to the passageway 202 via a coaxial cable 218. The beamguide 200 operates as a waveguide to support the microwave electric fields in the passageway 202 by supporting a traveling wave propagating in a direction toward the exit end 212. Microwave energy from the power source 216 is provided to the port 214 via a coax coupling to couple microwave power from the power source 216 to the beamguide 200 for exciting a single microwave mode or multiple microwave modes as a traveling wave along the beamguide 200. In one example, the multi-cusped magnetic fields provided by the magnets 220 are superimposed on the mass analyzer dipole magnetic field in portions of the beamguide 200 passing through the mass analyzer 114, whereas in other portions of the beamguide, the multi-cusped magnetic fields of the magnets 220 are the primary source of magnetic fields within the beamguide passageway 202.

Figure 4A:
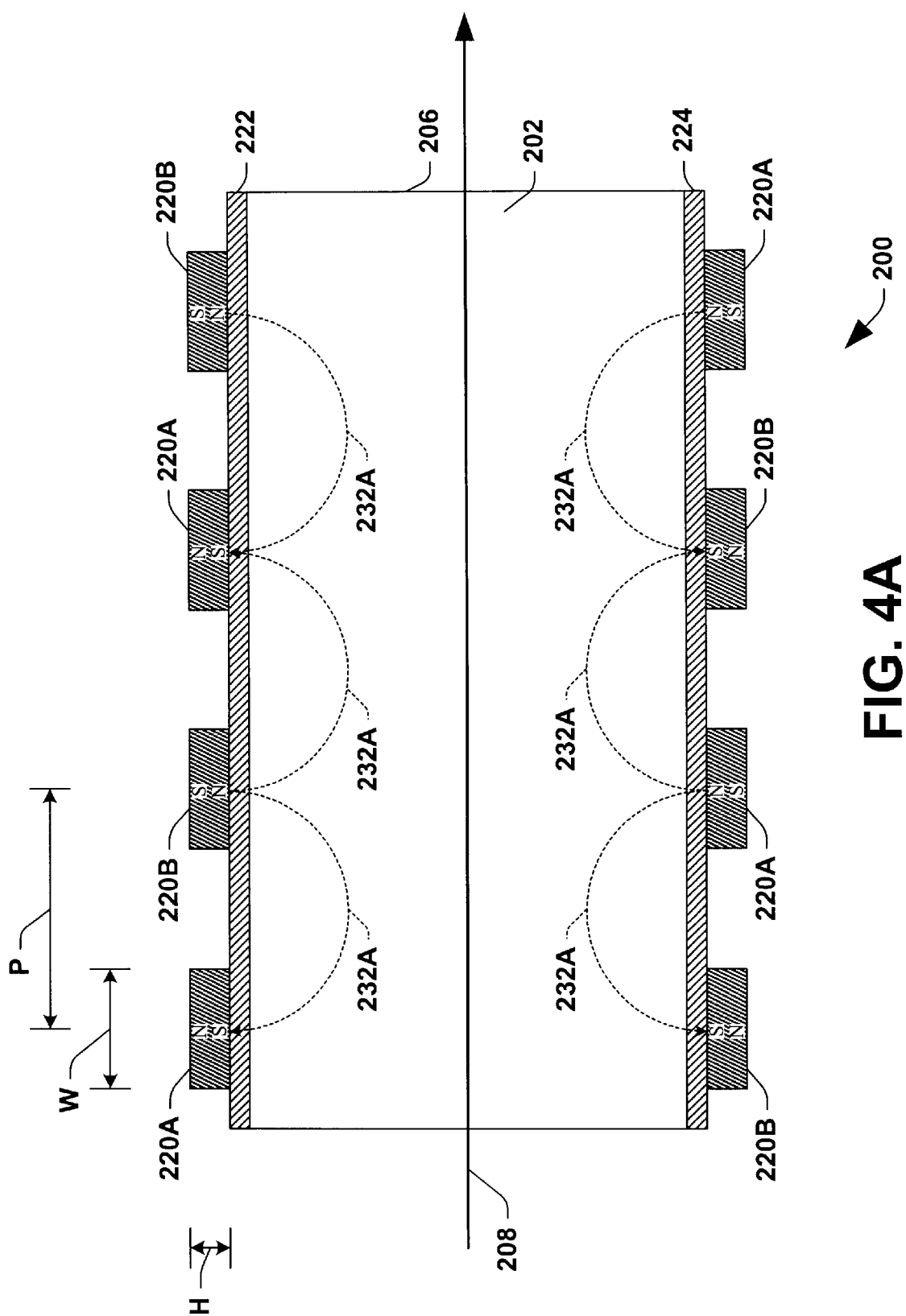
FIG. 4A is a sectional side elevation view of the beamguide of FIGS. 1B and 2 taken along line 4—4 of FIG. 2.
Figure 4B:
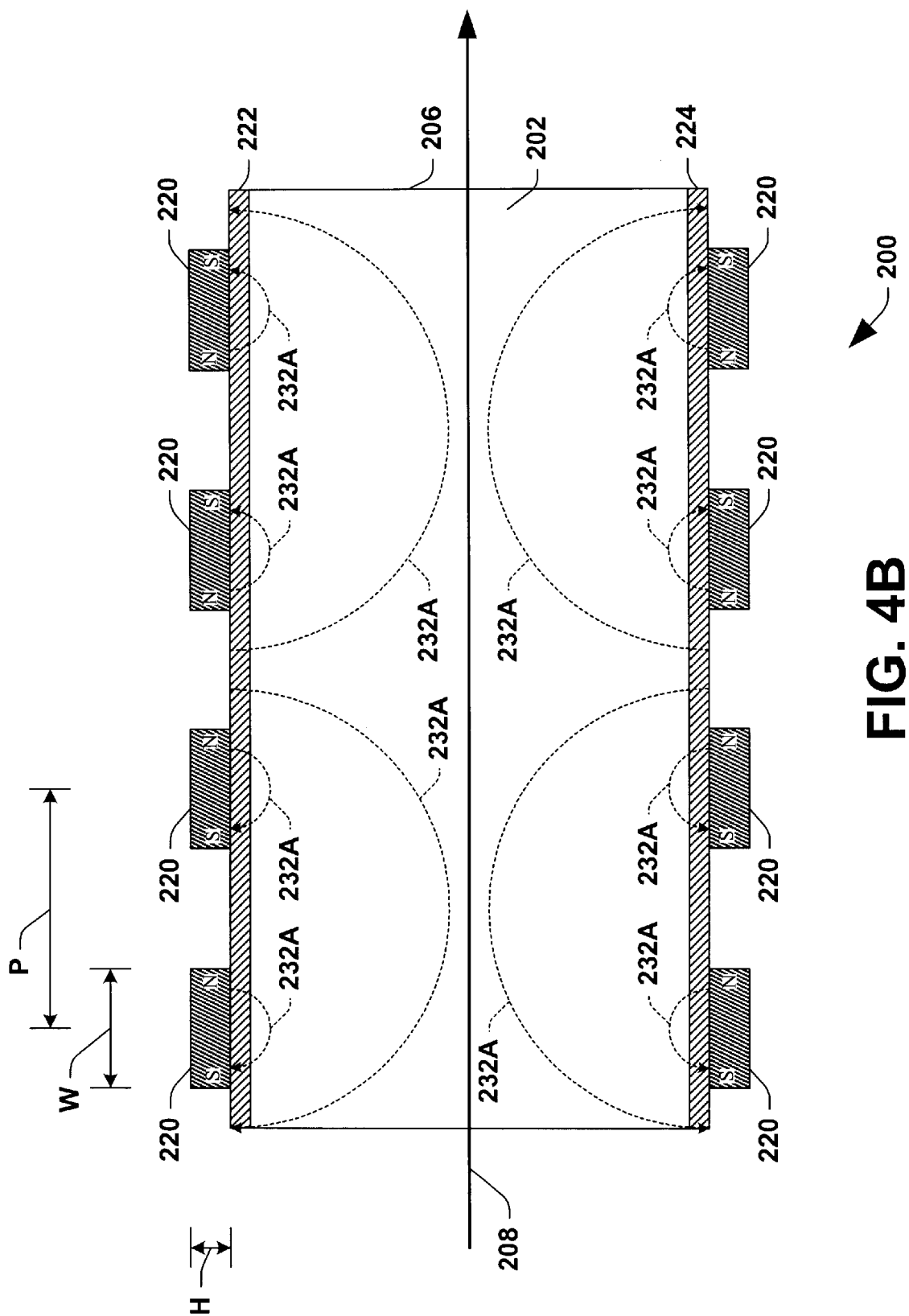
FIG. 4B is a sectional side elevation view of the beamguide of FIGS. 1B and 2 having an alternate magnet configuration.
Figure 4C:
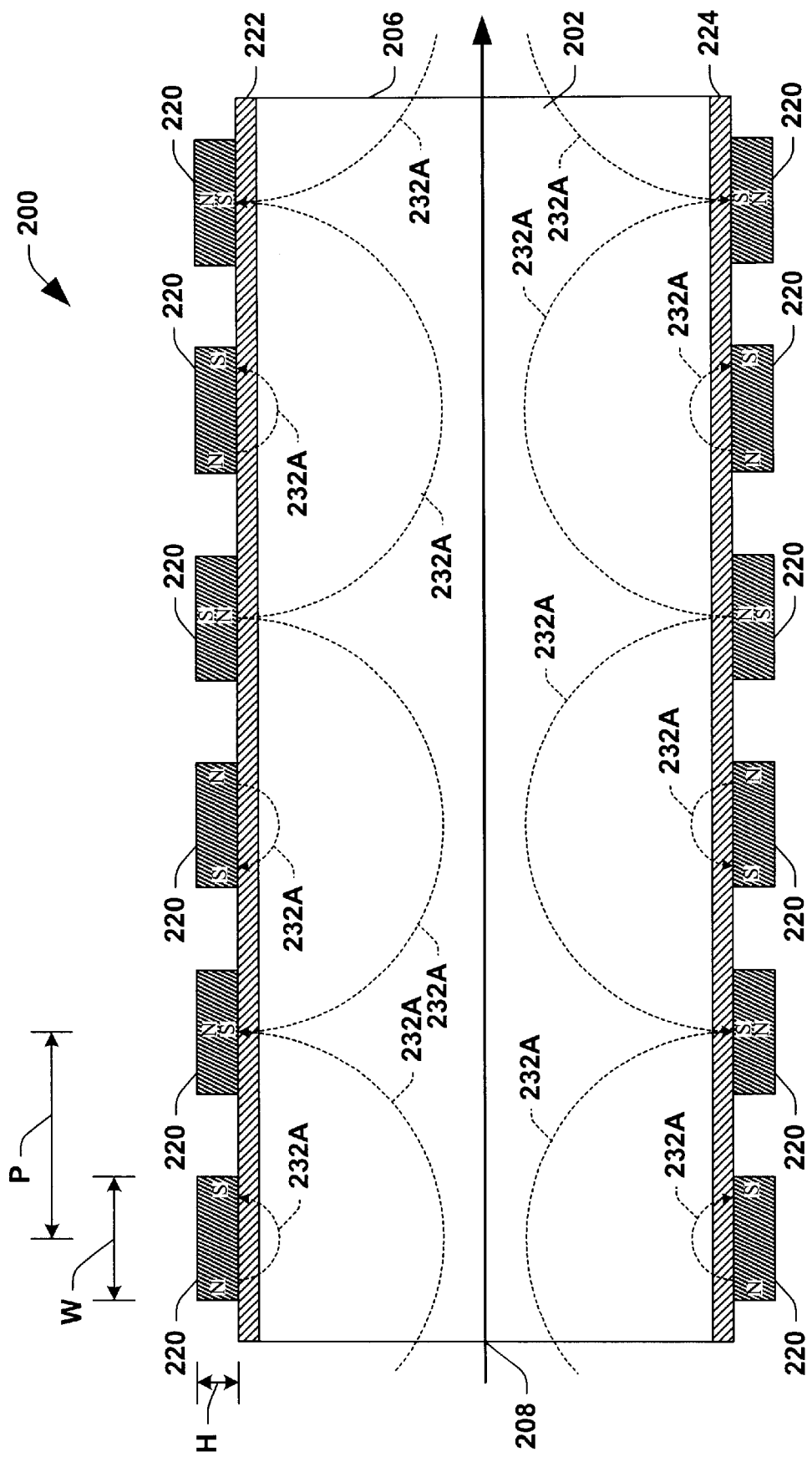
FIG. 4C is a sectional side elevation view of the beamguide of FIGS. 1B and 2 with another alternate magnet configuration.

FIGS. 3 and 4A illustrate the mass analyzer beamguide 200 in longitudinal and lateral section along section lines 3—3 and 4—4 of FIG. 2, respectively, wherein FIGS. 4B and 4C illustrate two possible alternate magnet configurations in the exemplary beamguide 200. As seen in FIG. 4A, the magnets 220 are magnetized along the vertical direction and are staggered such that adjacent magnets have like polarity poles facing in opposite directions. For clarity, the magnets 220 having South poles facing toward the passageway 202 are indicated as 220A and magnets 220 having South poles facing away from the passageway 202 are indicated as 220B, wherein the magnets 220 are mounted along the outer surfaces of the top and bottom beamguide walls 222 and 224, respectively. In the portion of the beamguide 200 which pass through the mass analyzer 114, a dipole magnetic field is established in the passageway 206, for example, via an external electromagnet (FIG. 1B) having vertical field lines 230 as illustrated in FIG. 3.

Figure 5A:
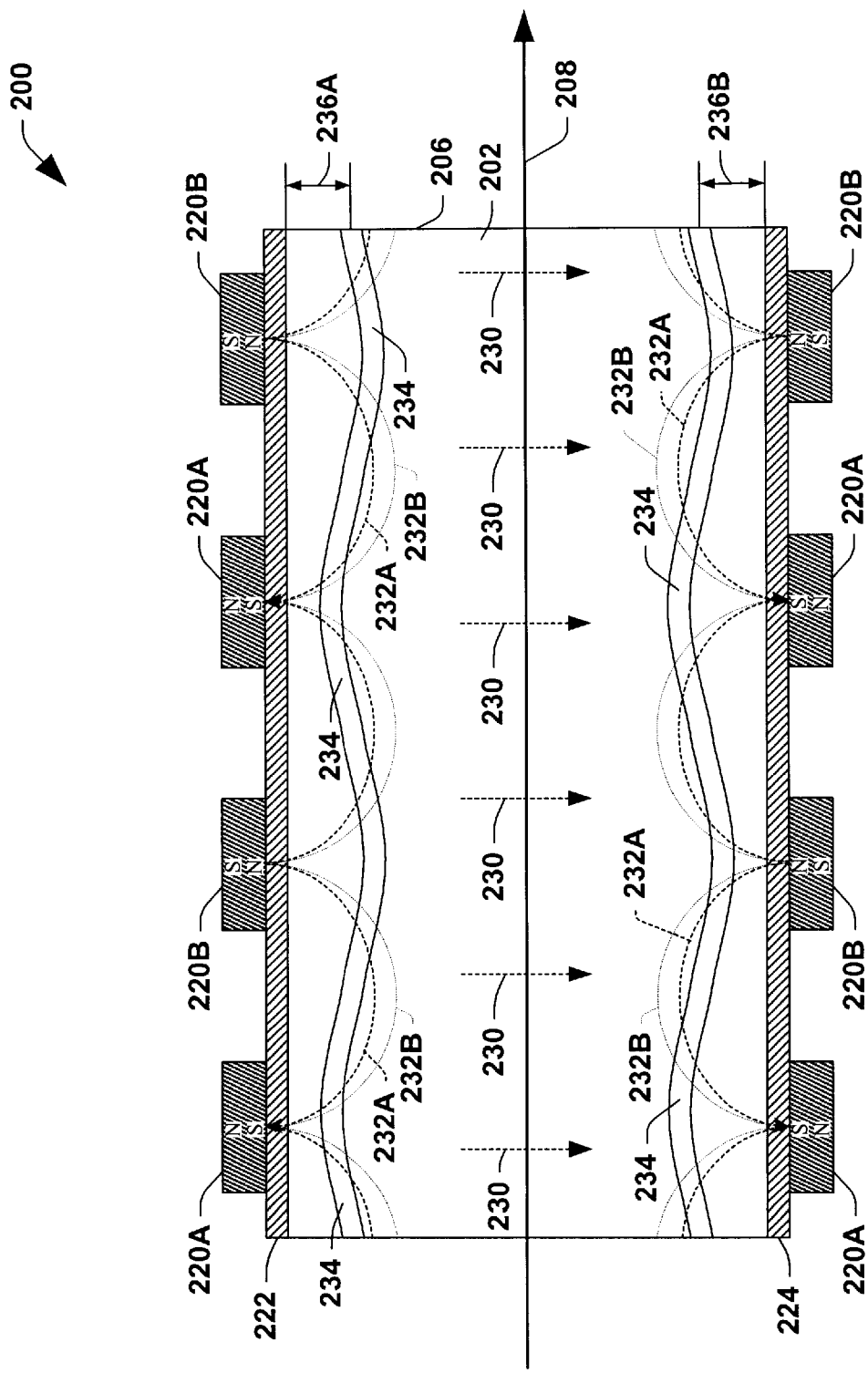
FIG. 5A is a side elevation view illustrating exemplary multi-cusped and dipole magnetic fields, as well as ECR zones in the beamguide of FIGS. 1B and 2.

Referring also to FIGS. 5A–5E, the exemplary bipolar magnets 220A and 220B create individual magnetic fields, illustrated for simplicity with exemplary field lines 232A and 232B in FIG. 5A, which cooperate to form multi-cusped magnetic fields near and spaced from the top and bottom walls 222 and 224, respectively, in the passageway 206. The exemplary placement of magnets 220A and 220B illustrated in the various figures illustrates similarly oriented magnets 220 on the top and bottom walls 222 and 224 which are generally vertically aligned (e.g., magnet 220A directly above magnet 220B, magnet 220B directly above magnet 220A). However, it will be appreciated that orientations other than those specifically illustrated and described herein are possible and are contemplated as falling within the scope of the present invention, some examples of which are illustrated in FIGS. 4B and 4C. In addition, it is noted that although the exemplary magnets 220 are generally rectangular, having a length, and width W and a height H, that other magnet shapes are contemplated within the scope of the invention, including but not limited to arcuate or wedge shaped magnets. In the illustrated example, the magnets 220A and 220B are SmCo having a length of about 100 mm, a width W of about 20 mm, and a height H of about 5 mm, and are spaced from one another by a pitch distance P of about 40 mm. In this regard, the structures illustrated in the various figures are not necessarily drawn to scale.

In accordance with one aspect of the present invention, the magnets 220A and 220B of FIGS. 4A and 5A–5E operate to generate a multi-cusped magnetic field within the passageway 202 of the beamguide 200, which interacts with microwave electric fields from the energized beamguide 200 to provide enhanced beam containment by establishing ECR regions or zones 234 in the passageway 202. The ECR regions 234 are spaced from the top and bottom walls 222 and 224 by distances 236A and 236B, respectively, which are about 12 mm in this example. Plasma develops along the ion beam in the beamguide 200 inherently due to the ionizing collisions between the ion beam and background gas(es) in the passageway 202. In addition, the generated plasma exhibits a density that is a function of a steady state equilibrium where charges produced by ionization and charge exchange are lost to the beamguide 200, for example, when additional charge formation is balanced with losses due to repulsion of positive charges by the residual space charge and electron escape due to kinetic energy. The steady state plasma density is distributed around the ion beam 128 and acts to space charge neutralize the beam.

The magnets 220A and 220B generate the multi-cusped magnetic fields 232 that may increase the beam containment by maintaining the plasma at a higher steady state equilibrium plasma density level. Accordingly, the multi-cusped field facilitates a high beam current under low energy conditions even without the introduction of externally generated plasma. In the mass analyzer portion of the beamguide 200, the magnets 220A and 220B may provide magnetic beam confinement using a magnetic mirror effect, wherein an increasing magnetic field gradient near poles of the dipole field is generated along portions of the beamguide 200. The increase in the magnetic field near the top and bottom walls 222 and 224 causes the magnetic mirror effect in those areas along the beamguide 200. The magnetic mirror effect prevents excessive depletion of plasma density, for example, by preventing electrons from being removed therefrom due to contact with the walls 222 and 224. By minimizing such electron loss, maintenance of the effective beam-induced plasma may be improved, thereby facilitating enhanced beam containment at low beam energies compared to conventional beamguides.

As shown in FIGS. 5A–5E, the exemplary orientation of the magnets 220A and 220B advantageously provides additive magnetic field lines in the areas between adjacent magnets 220, although this is not required for the present invention. In addition, the provision of microwave energy in the passageway 202 through the power source 216 and the feed port 214 (FIG. 2) provides cooperative interaction between the magnetic and electric fields to create an ECR condition in the regions 234 spaced from the walls 222, 224 by the distances 236A and 236B, respectively. The ECR condition in regions 234 advantageously provides enhancement of the beam plasma associated with an ion beam traveling through the passageway 202 along the path 208, whereby beam integrity is improved along the longitudinal length of the beamguide 200. The creation of this ECR condition in one or more regions 234 around an ion beam prevents beam "blow-up" by facilitating the transfer of energy to the plasma surrounding the beam, thereby enhancing the plasma.

Figure 5B:
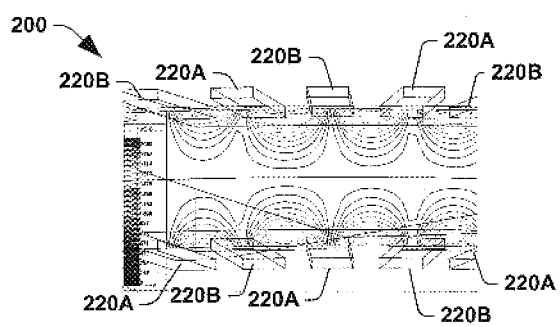
FIG. 5B is a sectional side elevation view showing multi-cusped constant vector potential contours in a portion of the beamguide of FIGS. 1B and 2 outside the mass analysis dipole magnetic field.
Figure 5C:
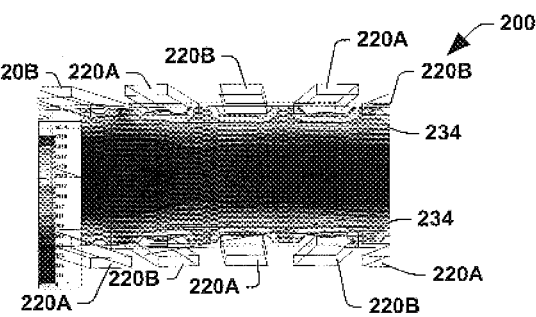
FIG. 5C is a sectional side elevation view showing multi-cusped constant magnetic field strength contours in the portion of the beamguide of FIGS. 1B and 2 outside the mass analyzer.
Figure 5D:
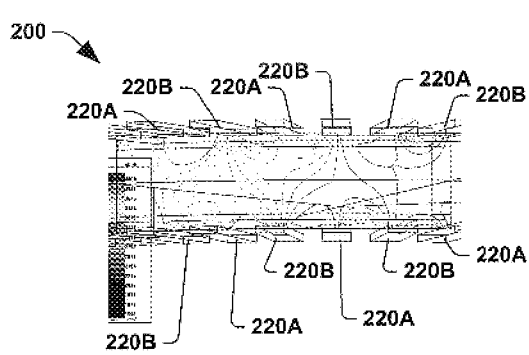
FIG. 5D is a sectional side elevation view showing multi-cusped and dipole constant vector potential contours in a portion of the beamguide of FIGS. 1B and 2 in the mass analysis dipole magnetic field.
Figure 5E:
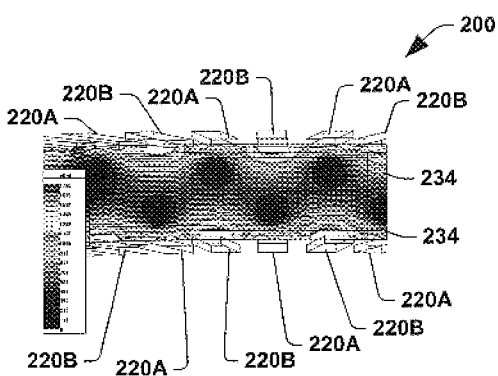
FIG. 5E is a sectional side elevation view showing multi-cusped and dipole constant magnetic field strength contours in the portion of the beamguide of FIGS. 1B and 2 in the mass analyzer.

An ECR condition occurs when an alternating electric field is applied to a charged particle in a static magnetic field, such that the frequency of the electric field matches the natural frequency of rotation of the charged particle around the static magnetic field lines. In this particular example, the electric fields are provided at a frequency of about 2.45 GHz, wherein the superimposed multi-cusped and dipole magnetic fields (fields 232 and 230) provide magnetic field strength of about 875 Gauss in the regions 234. FIGS. 5B and 5C illustrate multi-cusped constant vector potential contours and magnetic field strength contours, respectively, in a portion of the beamguide 200 outside the mass analysis dipole magnetic field. FIGS. 5D and 5E illustrate multi-cusped and dipole constant vector potential contours and magnetic field strength contours, respectively, in the portion of the beamguide 200 passing through the mass analyzer 114.

It will be appreciated that the sizing, orientation, and spacing of the magnets 220 within the passageway 206 allow the location of the ECR regions 234 to be generated in accordance with desired ion beam containment goals. For example, the strength of the magnets 220 may be varied in order to change the distance 236A and/or 236B between the inner surfaces of the beamguide walls 222, 224 and the ECR regions 234. In this manner, the distances 236A and 236B may be adjusted according to the passageway size and/or the desired ion beam size. In addition, the spacing between adjacent magnets 220 (e.g., pitch distance P in FIG. 4A) may be changed in order to vary the spacing between adjacent ECR regions 234. Furthermore, the relative orientations of the magnetic pole faces of adjacent magnets may be varied in order to provide additive magnetic field lines between adjacent magnets 220. Many different magnet sizes, orientations, and spacings are possible and are contemplated as falling within the scope of the present invention. In another possible implementation (not shown), magnets 220 are provided comprising NdFeB having dimensions 140× 24×5 mm (length×width W×height H), which are spaced by a pitch distance P of 32 mm. In this example, the magnets are configured with a pair of two adjacent magnets having South poles facing the passageway 202 and the next pair having South poles facing away from the passageway 202, which provides ECR regions 234 spaced from the walls 222, 224 by a distance 236 of about 5 mm.

FIG. 4B illustrates yet another possible configuration wherein the direction of magnetization is along the longitudinal direction, in which the poles of adjacent magnets 220 are facing one another In the illustrated example, the magnets 220 of FIG. 4B are made of SmCo having dimensions 140×18×5 mm (length×width W×height H) and are spaced by a pitch distance P of 32 mm. This example provides ECR regions 234 spaced from the walls 222, 224 by a distance 236 of about 7 mm for an electric field microwave frequency of 2.45 GHz. FIG. 4C illustrates still another possible configuration, wherein the magnets 220 are alternated between longitudinal and vertical pole orientations. In one implementation of the configuration of FIG. 4C with magnets 220 made of SmCo having dimensions 140×18×5 mm (length×width W×height H) and a pitch spacing P of 32 mm, the ECR regions 234 are spaced from the walls 222, 224 by a distance 236 of about 11 mm for an electric field microwave frequency of 2.45 GHz. In another example the magnets 220 are made of NdFeB having dimensions 140 ×24×7 mm (length×width W×height H) using a pitch spacing P of 32 mm, where the ECR regions 234 are spaced from the walls 222, 224 by a distance 236 of about 22 mm. Thus, the magnet dimensions, materials, shapes, and orientations may be varied within the scope of the invention to achieve any desired location of the ECR regions 234.

Referring now to FIGS. 6A–6E, another exemplary low energy ion implantation system 300 is illustrated including an ion source 312, a mass analysis magnet 314, an end station 316, and a beamline assembly 315 comprising a beam containment apparatus in accordance with the invention. The beamline comprises a beamguide 400 with aluminum walls extending from an entrance end 410 near the source 312 to an exit end 412 near a resolver 323 and a beam neutralizer 324. The beamguide 400 defines a passageway 402 through which an ion beam 328 is transported from the source 312 to the end station 316. A plurality of magnets 420 are mounted along an outer surface of the upper and lower beamguide walls to provide multi-cusped magnetic fields in the beamguide passageway, and a power source 316 is coupled with the beamguide 400 to provide microwave electric fields along at least a portion of the passageway 402, which interact with the multi-cusped magnetic fields to provide beam containment of the ion beam in the beamguide passageway 402.

The beamguide 400 passes through the mass analyzer 314, wherein the multi-cusped magnetic fields from the magnets 420 are in addition to a dipole magnetic field from the mass analyzer magnets, such that ECR resonance regions or zones are established in the passageway 402. As with the other implanters illustrated and described above, the mass analyzer 314 operates to direct ions of a desired charge-to-mass ratio along the path toward the end station 316. The energized beamguide 400 operates as a waveguide to support a traveling wave propagating in a direction toward the exit end 412, wherein the power source 316 may be operated at any microwave frequency, such as 2.45 GHz in one example. The exemplary beamguide 400 comprises a feed port 376 located along the outer beamguide sidewall, as well as a microwave coupler 378 connected to the feed port 376 to couple microwave power from the power source 316 to the beamguide 400 for exciting a single microwave mode or multiple microwave modes as a traveling wave along the beamguide 400. For example, the exemplary beamguide may be excited for TE01, TE10 or other modes at microwave frequencies using appropriate coax to waveguide mode converter designs for the coupler 378 in order to provide the traveling wave along the passageway 402. The coupler 378 includes a coax feed 378a to connect the beamguide 400 to the output of the power source 316, as well as adjustable stub tuners 378b having rods projecting into the beamguide interior to allow adjustment of the power coupling (e.g., impedance matching) of the beamguide 400 for maximum transmission. In operation, the exemplary beamguide may be setup using initial settings for providing a traveling wave with no beam or plasma in the passageway 402, and thereafter the tuners 378b may be adjusted when an ion beam and plasma are provided in the beamguide 400.

The beamguide 400 in this example also comprises an entrance wall 430 near the entrance end 410, which is spaced from the feed port 376 by a distance 432. The entrance wall 430 comprises a slit shaped entrance aperture 434 along the path through which the ion beam 328 passes. The entrance wall 430 operates as a cutoff for the microwave mode or modes to create a reflected wave propagating along the beamguide 400 in the direction toward the exit end 412. Any number of apertures of any shape may be provided in accordance with the invention, wherein the apertures are small enough to present a cutoff conduction at the entrance wall 430 to reflect the wave back toward the exit end 412 of the beamguide 400. For example, a honeycomb pattern of circular holes may be provided in the entrance wall 430, or a grid pattern of elongated slots may alternatively be provided within the scope of the invention.

In addition, the exemplary spacing distance 432 between the feed port 376 and the entrance wall 430 is such that the reflected wave and an incoming wave from the feed port 376 are generally in phase, to provide the traveling wave. A traveling wave advantageously provides distributed microwave electric fields along the entire beam path, or select portions thereof in the beamline assembly 315, wherein the exemplary beamline apparatus illustrated and described herein achieves a low voltage standing wave ratio (VSWR), thereby avoiding local high electric fields near the feed port 376 and microwave power reflection towards the source 312. Thus, the single microwave mode, or multiple modes are excited inside the ion beamguide 400 as a traveling wave, the electric field of which serves as the resonance electric field to establish ECR zones for plasma enhancement and the resultant beam confinement.

Figure 6A:
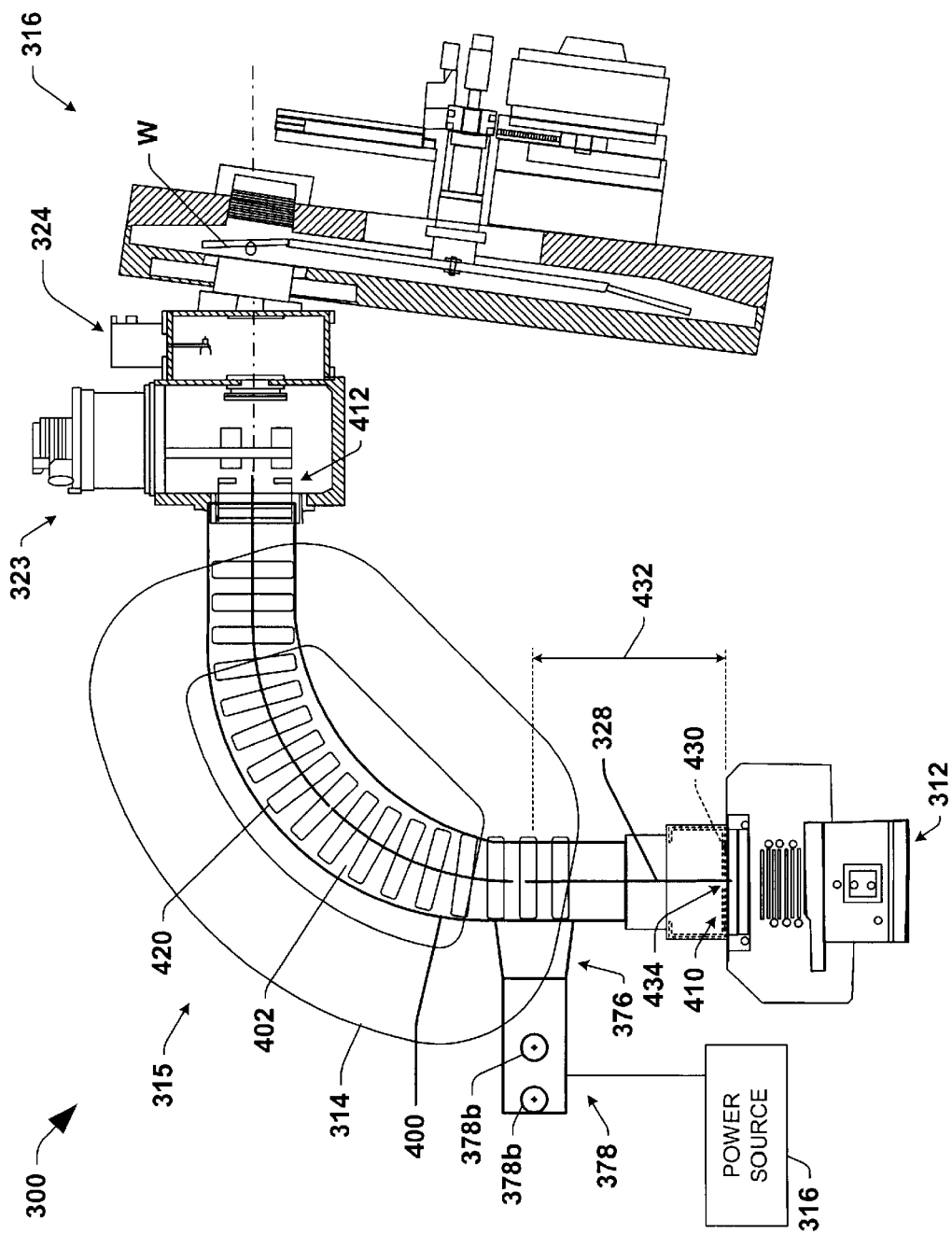
FIG. 6A is a top plan view illustrating another exemplary ion implantation system with beam confinement apparatus in accordance with the invention.
Figure 6C:
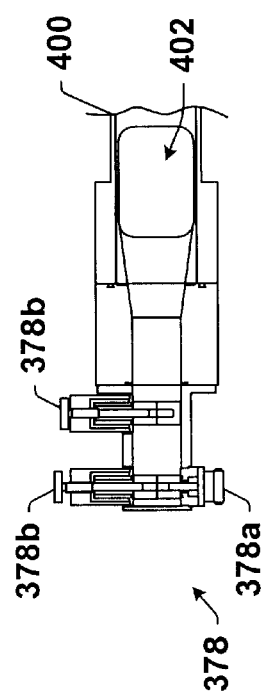
FIG. 6C is a partial side elevation view in section taken along line 6C—6C of FIG. 6B illustrating further details of the beamguide microwave coupler.
Figure 6B:
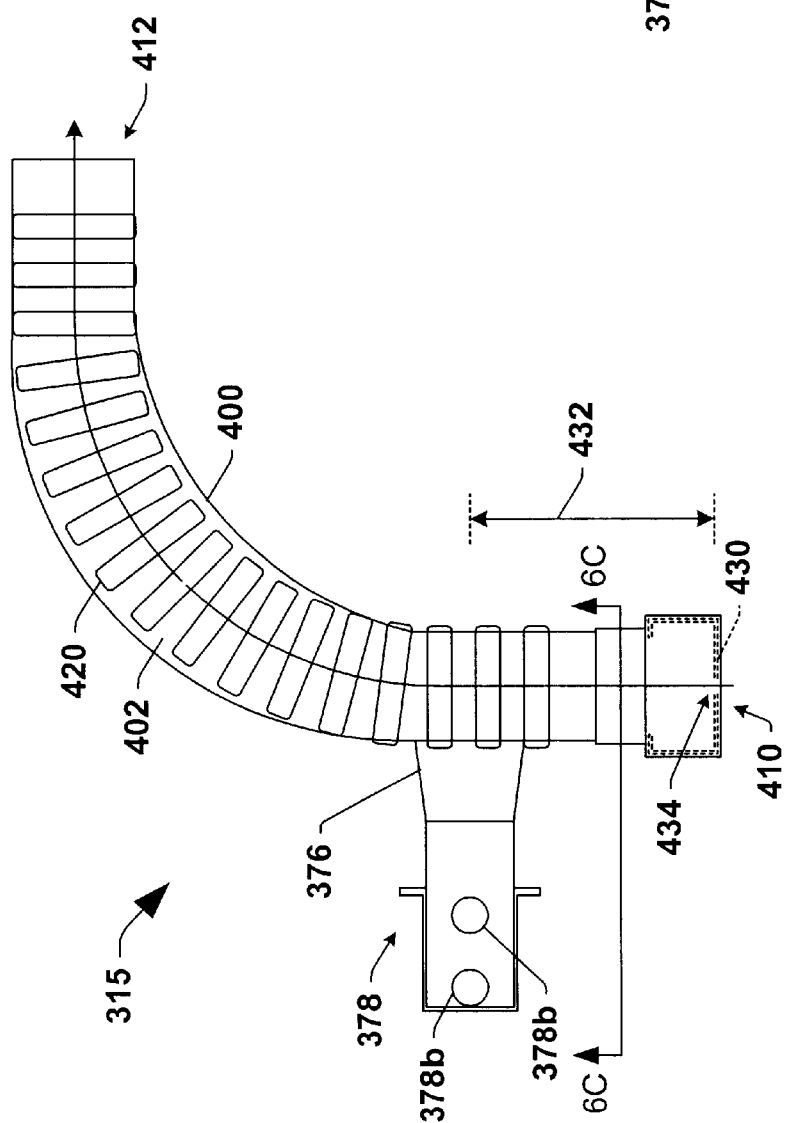
FIG. 6B is a top plan view illustrating further details of the beamline assembly of the system in FIG. 6A.
Figure 6D:
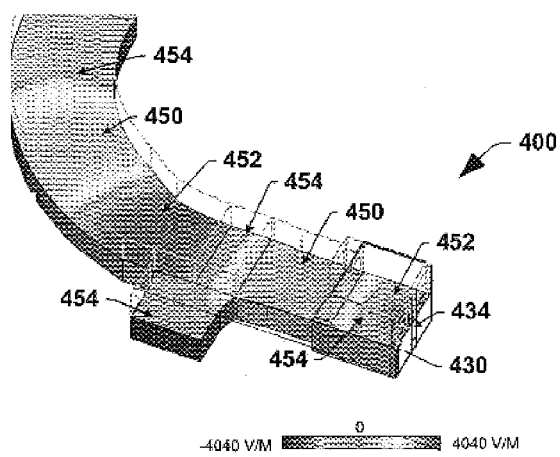
FIGS. 6D and 6E are perspective views illustrating electric fields in the beamguide of FIGS. 6A and 6B for transverse electric modes TE01 and TE10, respectively.
Figure 6E:
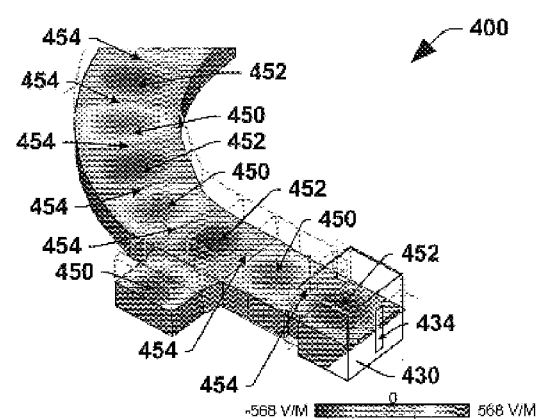

FIGS. 6D and 6E illustrate electric fields in the beamguide 400 for transverse electric modes TE01 and TE10, respectively, showing high positive field areas 450, high negative field areas 452, and zero field areas 454 at the median plane (e.g., center) of the beamguide 400. The illustrated example provides a microwave coupling design when the selected mode is TE01 or TE10 at a center frequency of 2.45 GHz where the propagation direction is toward the exit end 412 of the beamguide 400. The "T" portion of the beamguide structure 400 provides for introduction of microwave energy into the passageway 402 without obstructing the ion beam. The entrance aperture 434 at the entrance end 410 allows the ion beam to come into the passageway 402, but is sized to present a cut-off condition for the particular excitation mode or modes at the selected operating frequency (e.g., 2.45 GHz in this example). Consequently, a reflected wave is created by the equivalent short-circuit condition of the entrance aperture 434, where the reflected wave joins the incoming wave from the feed port 376 at the "T" portion. A traveling wave is thus established from the "T" portion to the exit end 412, where a standing wave is provided between the entrance end 410 and the "T" portion of the beamguide 400.

In addition, the spacing distance 432 (e.g., the relative location of the feed port 376 and the equivalent short-circuit entrance aperture 434) is such that the reflected wave is in phase with the incoming wave, creating a traveling wave at the other output arm of the "T" portion. In this example, the distance 432 is approximately one half wavelength for the exemplary 2.45 GHz operating frequency to provide the in-phase relationship between the incoming wave and the reflected wave. However, the invention is not limited to the illustrated structures, wherein the dimension of the main beamguide and the "T" feed structure can be varied to minimize microwave reflection to the input arm of the "T" for a given mode or modes and operating frequency, wherein the distance 432 may be an integer multiple of one half the wavelength. Further, as discussed above, the type, size, shape, and orientation of the magnets 420 may be selected to provide any desired ECR zone location within the beamguide 400, wherein the ECR regions may, but need not, be continuous throughout the beamguide passageway 402. Further, the coupler 378 may be designed for any desired coax to waveguide transition for a particular application. In this regard, the TE01 and TE10 modes for a rectangular cross-section beamguide (e.g., beamguide 400 and others described herein) are for illustration purposes, and other modes for a beamguide with a rectangular cross-section, or for beamguides having other cross-sectional shapes can be excited in accordance with the invention.

In the exemplary beamguide 400, a transmission of grater than 80% can be achieved using a center frequency of about 2.45 GHz with a bandwidth of about +/−30 MHz. In this particular implantation, the main beamguide 400 has a broad wall dimension of about 90 mm at the source side (e.g., near the entrance end 410), which is tapered out to about 130 mm at the exit end 412. The narrow wall dimension is about 66 mm with a center ray bending radius of 300 mm. The input arm of the "T" section has a broad wall dimension of 78 mm and a narrow wall dimension of 66 mm, wherein the input arm length is not critical. In the illustrated beamguide 400, moreover, the distance 432 from the entrance slot aperture 434 to the center of the broad wall of the input arm at the "T" section is 218 mm, wherein the wavelength for operation at a frequency of 2.45 GHz, vacuum (free space) is 122.4 mm. In this implementation, the 3 modes having the lowest cutoff frequency for a rectangular waveguide are single TE10, TE01, and TE11 modes. For single TE10 mode, the beamguide cutoff frequency fc (e.g., 15 GHz/broad wall dimension of 9 cm) is 1.67 GHz, the guide wavelength (e.g., the vacuum wavelength divided by the square root of the quantity $[1-(fc/f)^2]$) is 167 mm, and the power transmission at the exit end 412 is about 95% in a 50 MHz band centered around 2450 MHz. For single TE01 mode, the main guide cutoff frequency fc (e.g., 15 GHz/narrow wall dimensions of 6.6 cm) is 2.27 GHz, the guide wavelength (vacuum wavelength/square root of the quantity $[1-(fc/f)^2]$) is 32.5 cm, and the power transmission at the exit end 412 is 90% in a 50 MHz band centered around 2450 MHz. For single TE11 mode, the main guide cutoff frequency fc (e.g., 15 GHz times the square root of the quantity $[1/a^2+1/b^2]$ where a is the broad wall dimension 13 cm and b is the narrow wall dimension 6.6 cm) is 2.55 GHz, with no propagation to the exit end 412 below this frequency.

Higher order modes are excluded in design for the exemplary structure, wherein the choice of whether to propagate TE10 or TE01 in the main guide depends on excitation. It is possible that some of the higher order modes may actually be advantageous, but keeping microwave power within a particular high order mode is difficult to do. In the illustrated example, the broad wall dimension a is controlled for TE10, or the narrow wall dimension b is controlled for TE01, so as to control the guide wavelength. For an ideal microwave transmission line, the input port (e.g., the center) of the "T" section of the beamguide 400 would be located at about n*(half guide wavelength) from the cutoff at the entrance aperture 434 (e.g., distance 432), wherein actual design may deviate from this exact value due to the three dimensional nature of the beamguide structure 400, for example, to optimize transmission at a particular center frequency (e.g., 2.45 GHz) by trial and error. In addition, the wavelength and impedance of the beamguide 400 may change in the presence of a plasma load, wherein the stub tuners 378b provide adjustability for the beamguide 400, wherein any number (e.g., 2 or 3 in most cases) of tuners 378b may be provided to accommodate any load impedance.

Figure 7B:
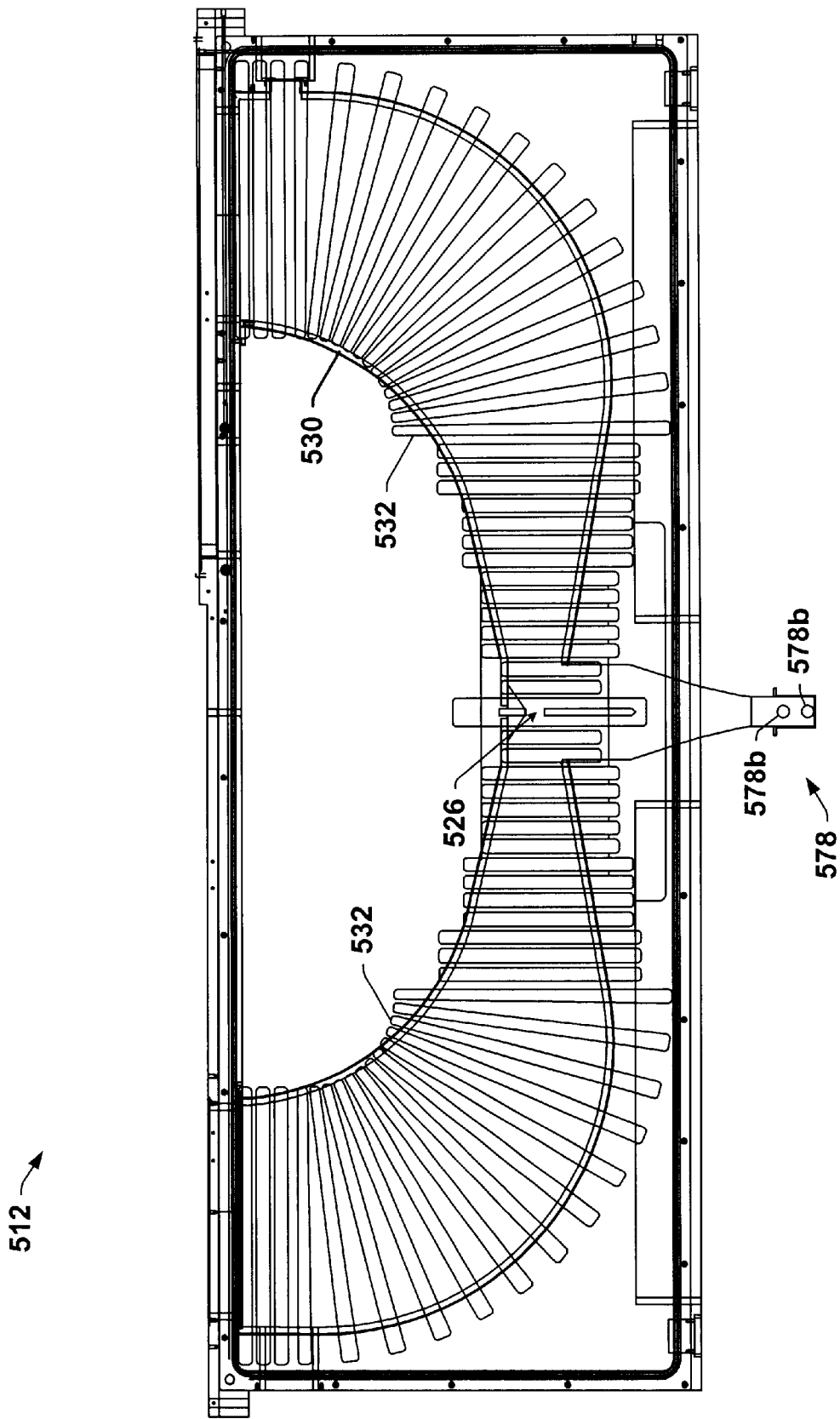
FIG. 7B is a side elevation view illustrating further details of the beamline assembly of the system in FIG. 7A.
Figure 7C:
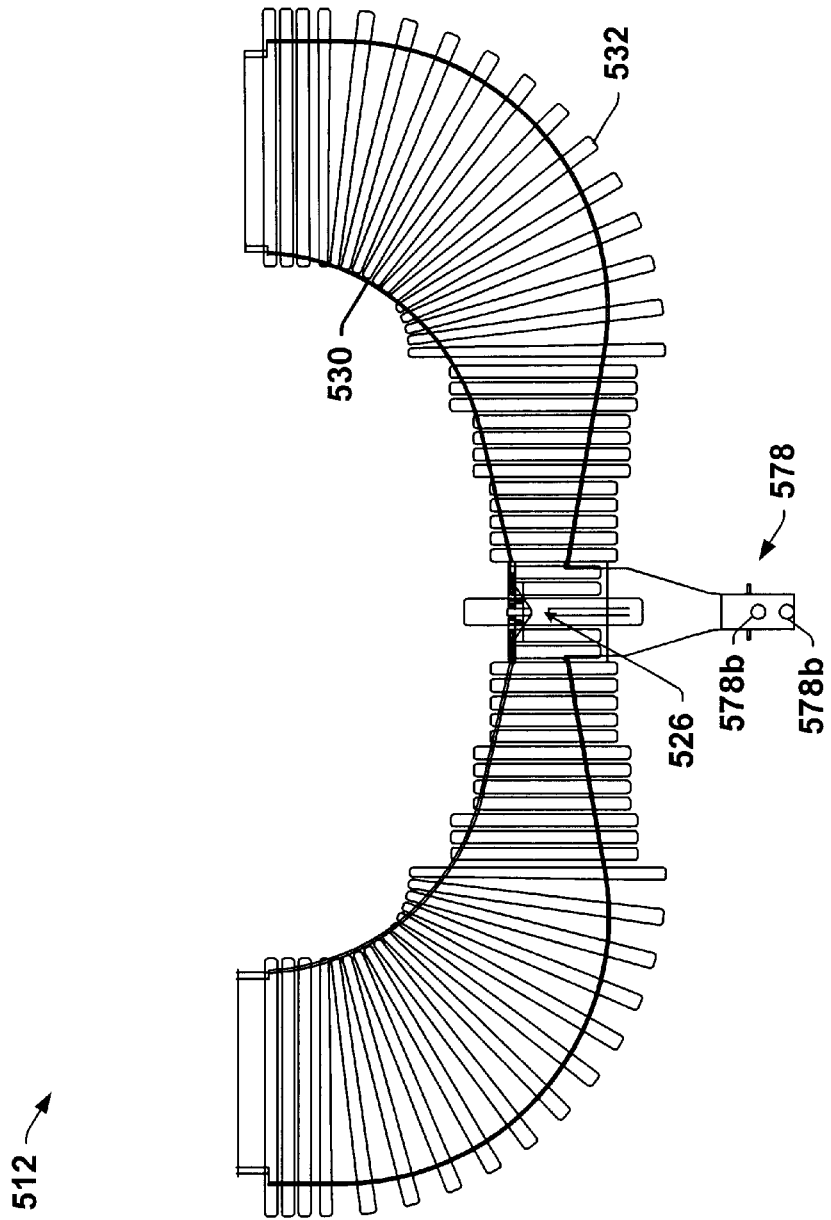
FIG. 7C is a side elevation view illustrating further details of the beamguide of the system in FIG. 7A.

Referring now to FIGS. 7A–7G, the various aspects of the invention may also be carried out in a symmetrical beamline assembly. An ion implantation system 502 is illustrated in FIG. 7A comprising an ion source 504 for producing an elongated (e.g., ribbon-shaped) ion beam along a longitudinal beam path, wherein the system 502 is described in U.S. patent application Ser. No. 10/210,124 filed Jul. 31, 2002, entitled "Symmetric Beamline and Methods for Generating a Mass-Analyzed Ribbon Ion Beam", assigned to the assignee of the present invention, Axcelis Technologies, Inc., the entirety of which is hereby incorporated by reference as if fully set forth herein. The system 502 comprises a beamline assembly 512 located downstream of the ion source 504, including a beamguide 530, a microwave power source 516 providing microwave power to the beamguide 530 via a coupler 578, and a mass analyzer comprising first and second magnets 522 and 524 positioned along the path to receive the beam from the source 504. The coupler 578 comprises a coax feed 578a for receiving power from the power source 516, as well as a pair of stub tuners 578b. The mass analyzer 514 operates to provide a magnetic field across the path so as to deflect ions from the incoming elongated ion beam from the source 504 at varying trajectories according to mass (e.g., charge to mass ratio) in order to provide an elongated mass analyzed output ion beam of similar or identical aspect ratio and profile to an end station 518. The end station 518 supports one or more workpieces such as semiconductor wafers (not shown) along the path for implantation using the mass analyzed ion beam from the beamline assembly 512.

The first mass analyzer magnet 522 provides a first magnetic field to the elongated ion beam mass separation of desired mass ions, wherein ions traveling through the first magnetic field experience a force which directs individual ions of a desired mass along the beam path of the beamline assembly 512 and which deflects ions of undesired mass away from the path. A resolving aperture 526 at the midpoint of the beam path in the symmetrical beamline assembly 512 passes only those ions of the desired mass, while intercepting the undesired ions. The second, substantially similar, magnet 524 is located downstream of the first magnet 522 and the resolving aperture 526 along the path, and provides a second magnetic field to collimate the intermediate mass analyzed ion beam so as to direct individual ions of the desired mass to the end station 518 as an elongated mass analyzed ion beam, wherein the beam enters and exits the beamguide 530 having an elongated ribbon profile, but passes through the resolving aperture 526 with a much smaller (e.g., pencil beam) profile.

As further illustrated in FIGS. 7B–7E, the beamguide 530 is an aluminum structure supporting two traveling waves, for example, in TE01 or TE10 mode, symmetrically excited in the beamguide 530, where the beam passageway defined by the beamguide 530 is connected to two output arms of a "T" feed. In the illustrated system 502, the broad walls of the beamguide 530 vary in dimension to accommodate the ribbon beam transport, wherein the "T" portion incorporates the resolving aperture 526 for the mass selected ion beam to pass through. The magnets 532 are mounted along an outer surface of the broad beamguide walls to provide multi-cusped magnetic fields in the beamguide passageway, where the power source 516 is coupled with the beamguide 530 to provide microwave electric fields along at least a portion of the passageway that interact with the multi-cusped magnetic fields to provide beam containment of the ion beam in the beamguide passageway. Where the beamguide 530 passes through the mass analyzer magnets 522 and 524 the multi-cusped magnetic fields from the magnets 532 are additive to the dipole magnetic field from the mass analyzer magnets 522 and 524, wherein ECR resonance regions or zones are established in the beam passageway.

Figure 7F:
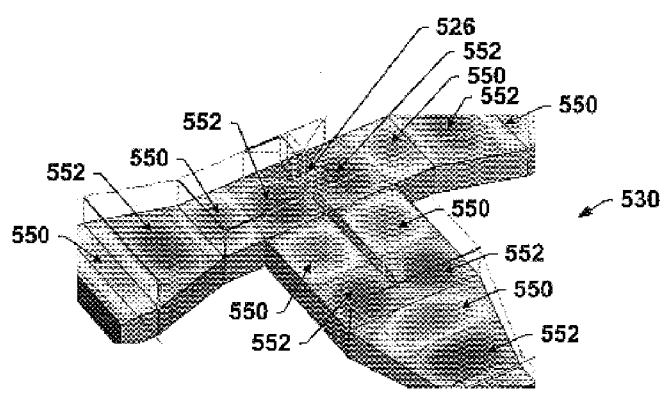
FIG. 7F is a perspective view illustrating electric fields in the central "T" portion of the beamguide of FIG. 7E for transverse electric mode TE10.
Figure 7G:
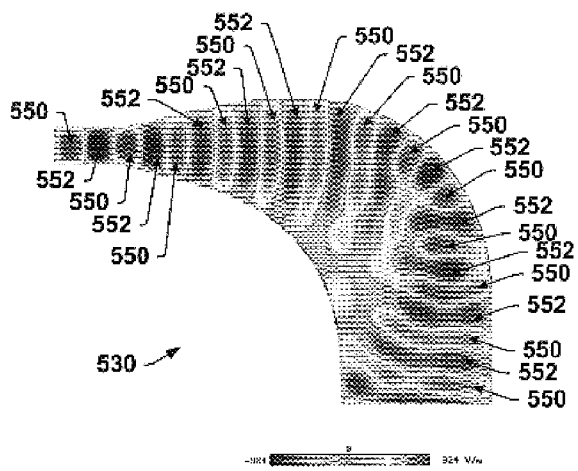
FIG. 7G is a perspective view illustrating electric fields in one of the end portions of the beamguide of FIG. 7E for transverse electric mode TE10.

The energized beamguide 530 is adapted to support a traveling wave propagating in both directions from the "T" portion toward the source 504 and toward the end station 518 (FIG. 7A), wherein the power source 516 may be operated at any microwave frequency, such as 2.45 GHz in one example. The exemplary coupler 578 couples the microwave power from the power source 516 to the "T" structure feed port for exciting a single microwave mode or multiple microwave modes as a traveling wave along the beamguide 530, for example, wherein the beamguide 530 may be excited for TE01, TE10, or other modes at microwave frequencies using appropriate coax to mode converter designs for the coupler 578 in order to provide the traveling wave for facilitating ECR plasma generation and the corresponding beam confinement advantages as discussed above. FIGS. 7F and 7G illustrate electric fields in the central and end portions of the beamguide 530, respectively, for TE10 mode energized at 2.45 GHz, showing high positive field areas 550 and high negative field areas 552 on the broad wall of the beamguide 530.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
   an ion source adapted to produce an ion beam along a path;
   a beamline assembly located downstream from the ion source, the beamline assembly comprising:
      a beamguide having at least one wall defining a passageway through which the ion beam is transported along the path;
      a magnetic device adapted to provide multi-cusped magnetic fields in the beamguide passageway; and
      a power source coupled with the beamguide to provide microwave electric fields in the beamguide passageway, wherein the microwave electric fields and the multi-cusped magnetic fields provide containment of the ion beam in the beamguide passageway; and
   an end station located downstream from the beamline assembly along the path, the end station being adapted to support a wafer along the path for implantation using the ion beam.

2. The ion implantation system of claim 1, wherein the magnetic device comprises a plurality of magnets mounted along at least a portion of the passageway.

3. The ion implantation system of claim 2, wherein the plurality of magnets are mounted along an outer surface of the at least one beamguide wall.

4. The ion implantation system of claim 3, wherein the beamline assembly comprises a mass analyzer through which a portion of the beamguide passes, the mass analyzer being adapted to receive the ion beam from the ion source and to direct ions of a desired charge-to-mass ratio along the path toward the end station.

5. The ion implantation system of claim 4, wherein the microwave electric fields and the multi-cusped magnetic fields provide containment of the ion beam at least in the portion of the beamguide passageway passing through the mass analyzer.

6. The ion implantation system of claim 5, wherein the microwave electric fields and the multi-cusped magnetic fields provide an electron cyclotron resonance condition along at least a portion of the passageway.

7. The ion implantation system of claim 6, wherein the beamguide operates as a waveguide to support the microwave electric fields in the beamguide passageway.

8. The ion implantation system of claim 7, wherein the beamguide comprises a top wall, a bottom wall, and first and second opposite side walls, wherein the top, bottom, and side walls extend from an entrance end proximate the ion source to an exit end proximate the end station to define the beamguide passageway along the path, and wherein the beamguide supports a traveling wave propagating along the beamguide in a direction toward the end station.

9. The ion implantation system of claim 8, wherein the beamguide comprises:
   a feed port located along one of the top, bottom, and side walls between the entrance and exit ends of the beamguide; and a microwave coupler connected to the feed port to couple microwave power from the power source to the beamguide for exciting a single microwave mode or multiple microwave modes as a traveling wave along the beamguide.

10. The ion implantation system of claim 9, wherein the beamguide comprises an entrance wall near the entrance end of the beamguide, the entrance wall comprising an entrance aperture along the path through which the ion beam passes, and wherein the entrance wall operates as a cutoff for the microwave mode or modes to create a reflected wave propagating along the beamguide in the direction toward the end station.

11. The ion implantation system of claim 10, wherein the feed port is located between the entrance and exit ends of the beamguide and spaced from the entrance wall by a distance such that the reflected wave and an incoming wave from the feed port are generally in phase to provide the traveling wave propagating along the beamguide in the direction toward the end station.

12. The ion implantation system of claim 1, wherein the beamline assembly comprises a mass analyzer through which at least a portion of the beamguide passes, the mass analyzer being adapted to receive the ion beam from the ion source and to direct ions of a desired charge-to-mass ratio along the path toward the end station.

13. The ion implantation system of claim 1, wherein the microwave electric fields and the multi-cusped magnetic fields provide an electron cyclotron resonance condition along at least a portion of the passageway.

14. The ion implantation system of claim 1, wherein the beamguide operates as a waveguide to support the microwave electric fields in the beamguide passageway.

15. The ion implantation system of claim 14, wherein the beamguide comprises a top wall, a bottom wall, and first and second opposite side walls, wherein the top, bottom, and side walls extend from an entrance end proximate the ion source to an exit end proximate the end station to define the beamguide passageway along the path, and wherein the beamguide supports a traveling wave propagating along the beamguide in a direction toward the end station.

16. The ion implantation system of claim 15, wherein the beamguide comprises:
a feed port located along one of the top, bottom, and side walls between the entrance and exit ends of the beamguide; and
a microwave coupler connected to the feed port to couple microwave power from the power source to the beamguide for exciting a single microwave mode or multiple microwave modes as a traveling wave along the beamguide.

17. The ion implantation system of claim 16, wherein the beamguide comprises an entrance wall near the entrance end of the beamguide, the entrance wall comprising an entrance aperture along the path through which the ion beam passes, and wherein the entrance wall operates as a cutoff for the microwave mode or modes to create a reflected wave propagating along the beamguide in the direction toward the end station.

18. The ion implantation system of claim 17, wherein the feed port is located between the entrance and exit ends of the beamguide and spaced from the entrance wall by a distance such that the reflected wave and an incoming wave from the feed port are generally in phase to provide the traveling wave propagating along the beamguide in the direction toward the end station.

19. A beamline assembly for transporting an ion beam from an ion source to an end station in an ion implantation system, the beamline assembly comprising:

a beamguide having at least one wall defining a passageway through which the ion beam is transported along the path;
a magnetic device adapted to provide multi-cusped magnetic fields in the beamguide passageway; and
a power source coupled with the beamguide to provide microwave electric fields in the beamguide passageway, wherein the microwave electric fields and the multi-cusped magnetic fields provide containment of the ion beam in the beamguide passageway.

20. The beamline assembly of claim 19, wherein the magnetic device comprises a plurality of magnets mounted along at least a portion of the passageway.

21. The beamline assembly of claim 20, wherein the plurality of magnets are mounted along an outer surface of the at least one beamguide wall.

22. The beamline assembly of claim 20, wherein the beamline assembly comprises a mass analyzer through which a portion of the beamguide passes, the mass analyzer being adapted to receive the ion beam from the ion source and to direct ions of a desired charge-to-mass ratio along the path toward the end station.

23. The beamline assembly of claim 22, wherein the microwave electric fields and the multi-cusped magnetic fields provide containment of the ion beam at least in the portion of the beamguide passageway passing through the mass analyzer.

24. The beamline assembly of claim 19, wherein the microwave electric fields and the multi-cusped magnetic fields provide an electron cyclotron resonance condition along at least a portion of the passageway.

25. The beamline assembly of claim 24, wherein the beamguide operates as a waveguide to support the microwave electric fields in the beamguide passageway.

26. The beamline assembly of claim 25, wherein the beamguide comprises a top wall, a bottom wall, and first and second opposite side walls, wherein the top, bottom, and side walls extend from an entrance end to an exit end to define the beamguide passageway along the path, and wherein the beamguide supports a traveling wave propagating along the beamguide in a direction toward the exit end.

27. The beamline assembly of claim 26, wherein the beamguide comprises:
a feed port located along one of the top, bottom, and side walls between the entrance and exit ends of the beamguide; and
a microwave coupler connected to the feed port to couple microwave power from the power source to the beamguide for exciting a single microwave mode or multiple microwave modes as a traveling wave along the beamguide.

28. The beamline assembly of claim 27, wherein the beamguide comprises an entrance wall near the entrance end of the beamguide, the entrance wall comprising an entrance aperture along the path through which the ion beam passes, and wherein the entrance wall operates as a cutoff for the microwave mode or modes to create a reflected wave propagating along the beamguide in the direction toward the exit end.

29. The beamline assembly of claim 28, wherein the feed port is located between the entrance and exit ends of the beamguide and spaced from the entrance wall by a distance such that the reflected wave and an incoming wave from the feed port are generally in phase to provide the traveling wave propagating along the beamguide in the direction toward the exit end.

30. The beamline assembly of claim 19, wherein the beamguide operates as a waveguide to support the microwave electric fields in the beamguide passageway.

31. The beamline assembly of claim 30, wherein the beamguide comprises a top wall, a bottom wall, and first and second opposite side walls, wherein the top, bottom, and side walls extend from an entrance end to an exit end to define the beamguide passageway along the path, and wherein the beamguide supports a traveling wave propagating along the beamguide in a direction toward the exit end.

32. The beamline assembly of claim 31, wherein the beamguide comprises:
   a feed port located along one of the top, bottom, and side walls between the entrance and exit ends of the beamguide; and
   a microwave coupler connected to the feed port to couple microwave power from the power source to the beamguide for exciting a single microwave mode or multiple microwave modes as a traveling wave along the beamguide.

33. The beamline assembly of claim 32, wherein the beamguide comprises an entrance wall near the entrance end of the beamguide, the entrance wall comprising an entrance aperture along the path through which the ion beam passes, and wherein the entrance wall operates as a cutoff for the microwave mode or modes to create a reflected wave propagating along the beamguide in the direction toward the exit end.

34. The beamline assembly of claim 33, wherein the feed port is located between the entrance and exit ends of the beamguide and spaced from the entrance wall by a distance such that the reflected wave and an incoming wave from the feed port are generally in phase to provide the traveling wave propagating along the beamguide in the direction toward the exit end.

35. A method of providing ion beam containment in an ion implantation system, comprising:
   providing an ion beam along a longitudinal path from an ion source to an end station;
   providing a multi-cusped magnetic field in at a beamguide passageway between the ion source and the end station; and
   providing a traveling wave along the beamguide, wherein microwave electric fields of the traveling wave and the multi-cusped magnetic field cooperate to provide ion beam containment along at least a portion of the beamguide passageway.

36. The method of claim 35, wherein providing the traveling wave comprises providing microwave power to the beamguide to excite a single microwave mode or multiple microwave modes as a traveling wave propagating along the beamguide in a direction toward the end station.

* * * * *